(12) United States Patent
Ha et al.

(10) Patent No.: US 11,688,778 B2
(45) Date of Patent: Jun. 27, 2023

(54) SEMICONDUCTOR DEVICE INCLUDING THREE-DIMENSIONAL FIELD-EFFECT TRANSISTOR WITH CURVED MULTI-LAYERED SOURCE/DRAIN PATTERN

(71) Applicant: SAMSUNG ELECTRONICS CO., LTD., Suwon-si (KR)

(72) Inventors: Ryong Ha, Seoul (KR); Dongwoo Kim, Incheon (KR); Gyeom Kim, Hwaseong-si (KR); Yong Seung Kim, Seongnam-si (KR); Pankwi Park, Incheon (KR); Seung Hun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 65 days.

(21) Appl. No.: 17/141,513

(22) Filed: Jan. 5, 2021

(65) Prior Publication Data
US 2021/0217860 A1 Jul. 15, 2021

(30) Foreign Application Priority Data
Jan. 15, 2020 (KR) .......................... 10-2020-0005365

(51) Int. Cl.
*H01L 29/417* (2006.01)
*H01L 29/423* (2006.01)
*H01L 29/10* (2006.01)

(52) U.S. Cl.
CPC .... *H01L 29/41758* (2013.01); *H01L 29/1033* (2013.01); *H01L 29/42356* (2013.01)

(58) Field of Classification Search
CPC ......... H01L 29/42356; H01L 29/41758; H01L 29/66795; H01L 29/785; H01L 27/0886; H01L 29/1033; H01L 29/0847; H01L 29/42392; H01L 29/7848
See application file for complete search history.

(56) References Cited

U.S. PATENT DOCUMENTS

| 9,502,518 B2 | 11/2016 | Liu et al. |
| 10,243,040 B1 | 3/2019 | Park et al. |
| 2017/0222006 A1* | 8/2017 | Suh .................. H01L 29/42392 |

(Continued)

FOREIGN PATENT DOCUMENTS

KR 10-2020-0136688 A 12/2020

*Primary Examiner* — Wasiul Haider
(74) *Attorney, Agent, or Firm* — Lee IP Law, P.C.

(57) ABSTRACT

A semiconductor device including an active pattern extending in a first direction; a channel pattern on the active pattern and including vertically stacked semiconductor patterns; a source/drain pattern in a recess in the active pattern; a gate electrode on the active pattern and extending in a second direction crossing the first direction, the gate electrode surrounding a top surface, at least one side surface, and a bottom surface of each of the semiconductor patterns; and a gate spacer covering a side surface of the gate electrode and having an opening to the semiconductor patterns, wherein the source/drain pattern includes a buffer layer covering inner sides of the recess, the buffer layer includes an outer side surface and an inner side surface, which are opposite to each other, and each of the outer and inner side surfaces is a curved surface that is convexly curved toward a closest gate electrode.

20 Claims, 30 Drawing Sheets

(56) References Cited

U.S. PATENT DOCUMENTS

| | | |
|---|---|---|
| 2017/0338327 A1* | 11/2017 | Liu ..................... H01L 29/6656 |
| 2019/0067490 A1 | 2/2019 | Yang et al. |
| 2019/0074362 A1 | 3/2019 | Lee et al. |
| 2019/0157444 A1 | 5/2019 | Yang et al. |
| 2019/0181257 A1 | 6/2019 | Jeong et al. |
| 2020/0381564 A1 | 12/2020 | Kang et al. |
| 2021/0057281 A1* | 2/2021 | Liaw ............... H01L 21/823487 |
| 2021/0082914 A1 | 3/2021 | Lee et al. |

* cited by examiner

SEMICONDUCTOR DEVICE INCLUDING THREE-DIMENSIONAL FIELD-EFFECT TRANSISTOR WITH CURVED MULTI-LAYERED SOURCE/DRAIN PATTERN

CROSS-REFERENCE TO RELATED APPLICATIONS

Korean Patent Application No. 10-2020-0005365, filed on Jan. 15, 2020, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Due to their small-sized, multifunctional, and/or low-cost characteristics, semiconductor devices are being esteemed as important elements in the electronic industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

The embodiments may be realized by providing a semiconductor device including a first active pattern on a first active region of a substrate, the first active pattern extending in a first direction; a first channel pattern on the first active pattern, the first channel pattern including semiconductor patterns, which are vertically stacked; a first source/drain pattern in a recess in an upper portion of the first active pattern; a gate electrode on the first active pattern and extending in a second direction crossing the first direction, the gate electrode surrounding a top surface, at least one side surface, and a bottom surface of each of the semiconductor patterns; and a gate spacer covering a side surface of the gate electrode and having an opening to the semiconductor patterns, wherein the first source/drain pattern includes a buffer layer covering inner sides of the recess, when viewed in a plan view, the buffer layer includes an outer side surface and an inner side surface, which are opposite to each other, and each of the outer and inner side surfaces is a curved surface that is convexly curved toward the gate electrode closest to the buffer layer.

The embodiments may be realized by providing a semiconductor device including a first active pattern on a first active region of a substrate, the first active pattern extending in a first direction; a first channel pattern on the first active pattern, the first channel pattern including semiconductor patterns, which are vertically stacked; a first source/drain pattern in a recess in an upper portion of the first active pattern; a gate electrode on the first active pattern and extending in a second direction crossing the first direction; and a gate spacer covering a side surface of the gate electrode and having an opening to the semiconductor patterns, wherein the first source/drain pattern includes a buffer layer covering inner sides of the recess, a main layer on the buffer layer to fill the recess, and an intermediate layer between the buffer layer and the main layer, the gate spacer includes a first spacer sidewall facing in the first direction, and a second spacer sidewall, which is an inner sidewall of the opening, when viewed in a plan view, the buffer layer covers the second spacer sidewall, and the second spacer sidewall is spaced apart from the main layer.

The embodiments may be realized by providing a semiconductor device including a substrate including a first active region and a second active region; a first active pattern on the first active region of the substrate and extending in a first direction; a first source/drain pattern in a first recess of an upper portion of the first active pattern; a second active pattern on the second active region of the substrate and extending in the first direction; a second source/drain pattern in a second recess of an upper portion of the second active pattern; a gate electrode on a first channel pattern of the upper portion of the first active pattern and a second channel pattern of the upper portion of the second active pattern and extending in a second direction crossing the first direction, each of the first and second channel patterns including semiconductor patterns, which are vertically stacked, the gate electrode surrounding a top surface, at least one side surface, and a bottom surface of each of the semiconductor patterns, a gate spacer covering a side surface of the gate electrode and having an opening to the semiconductor patterns; active contacts connected to the first source/drain pattern and the second source/drain pattern; a plurality of interconnection lines connected to the active contacts; a plurality of vias provided below the interconnection lines; and interlayer insulating layers covering the active contacts, the interconnection lines, and the vias, wherein the first source/drain pattern includes a buffer layer covering inner sides of the recess, an intermediate layer on the buffer layer, and a main layer on the intermediate layer to fill a remaining space of the recess, when viewed in a plan view, the buffer layer includes an outer side surface and an inner side surface, which are opposite to each other, and the outer side surface and the inner side surface are curved surfaces that are convexly curved toward the gate electrode closest to the buffer layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
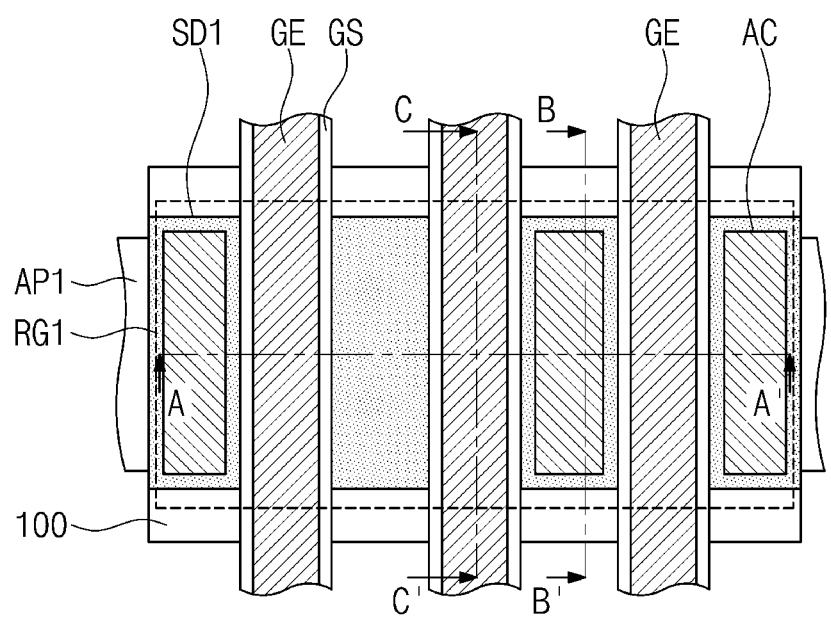
FIG. 1 is a plan view illustrating a semiconductor device according to an embodiment.
Figure 1:
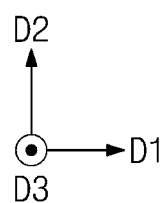
Figure 2:
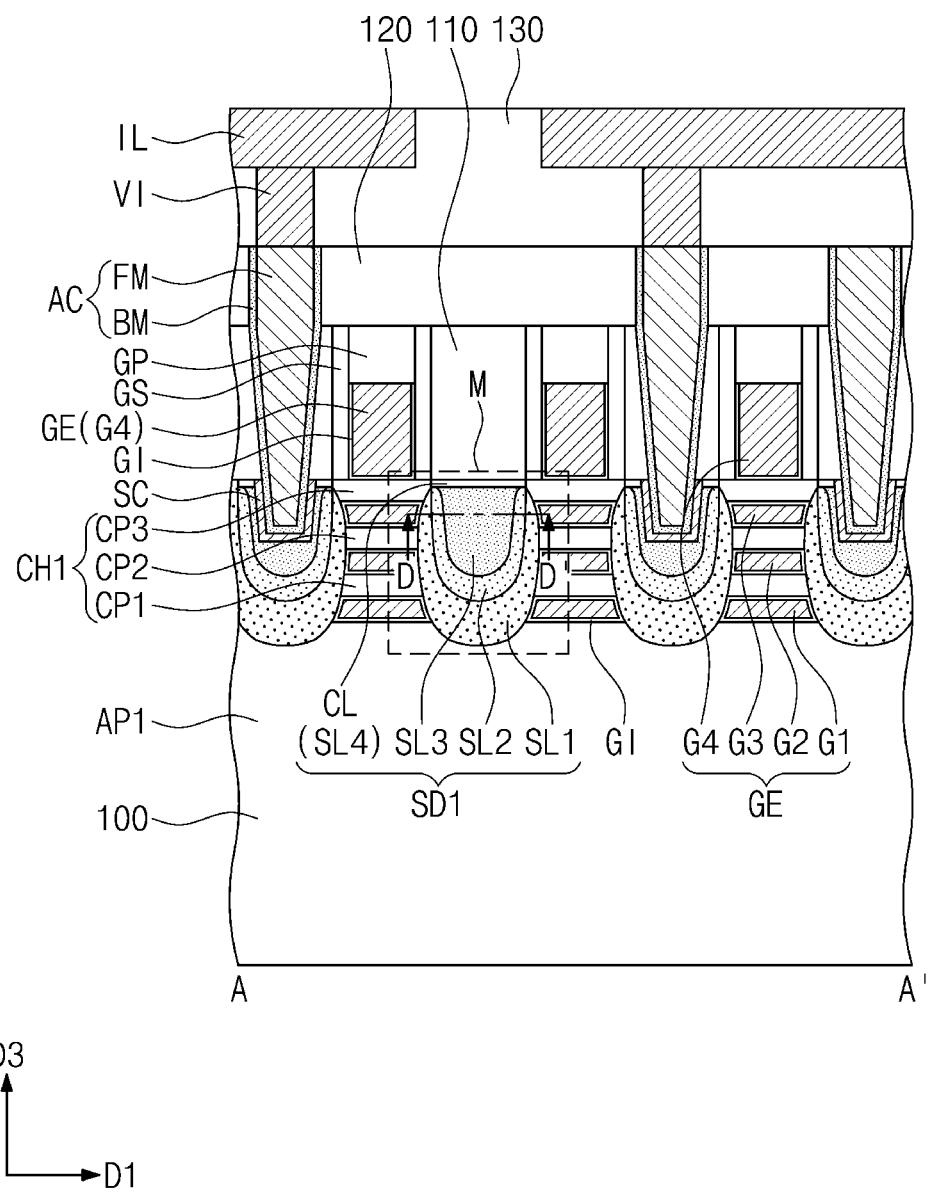
FIGS. 2 to 4 are sectional views taken along lines A-A', B-B', and C-C', respectively, of FIG. 1.
Figure 3:
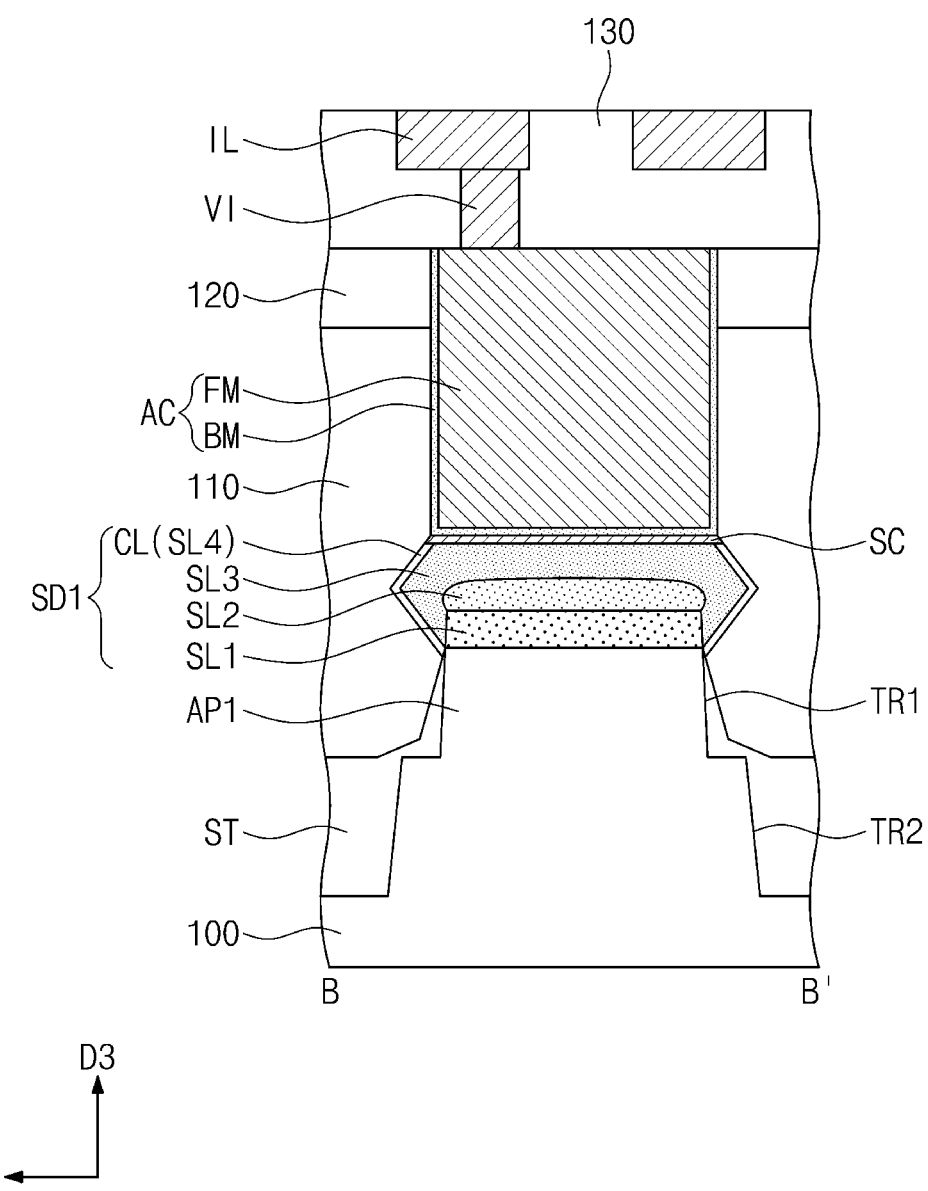
Figure 4:
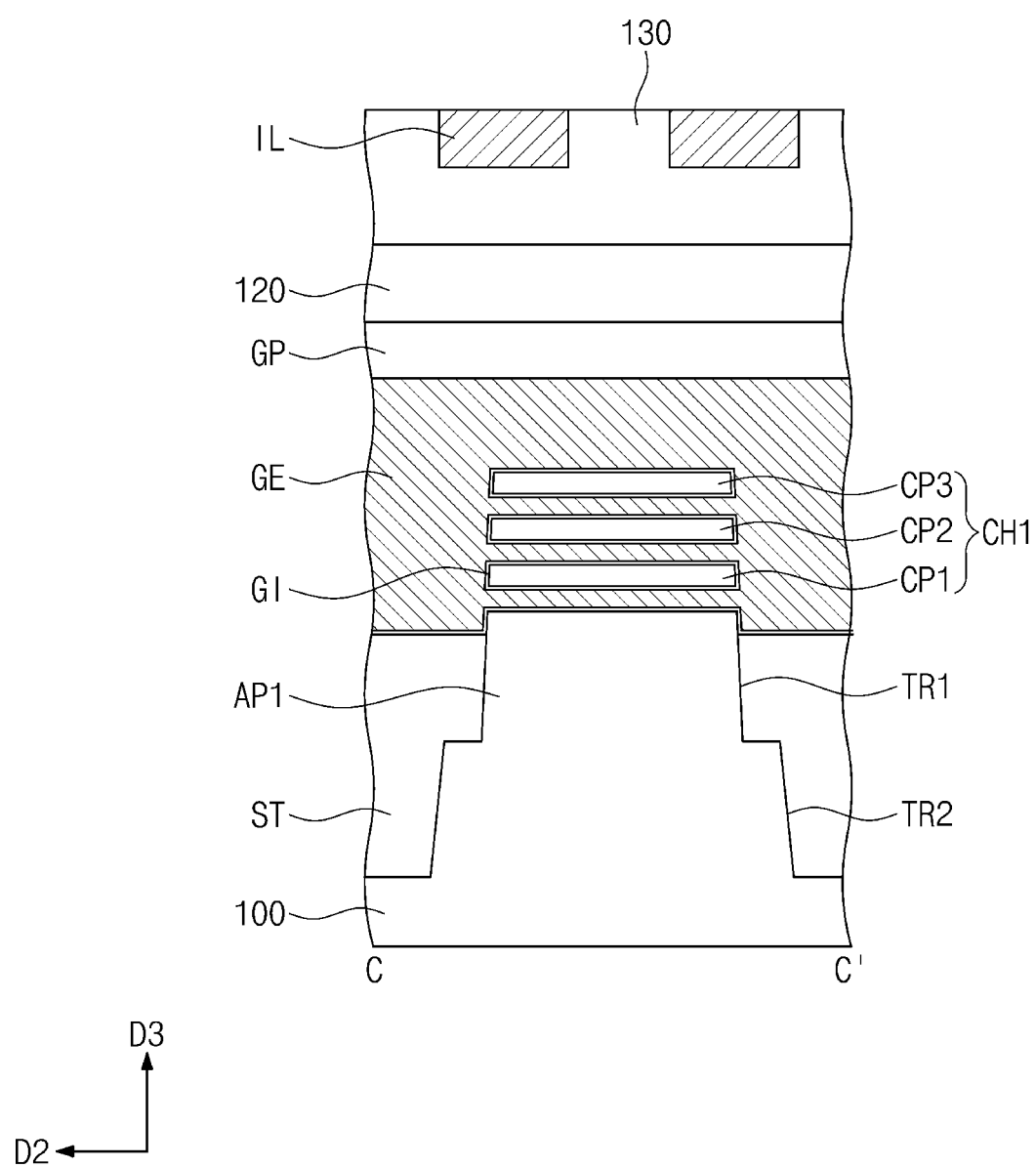
Figure 5:
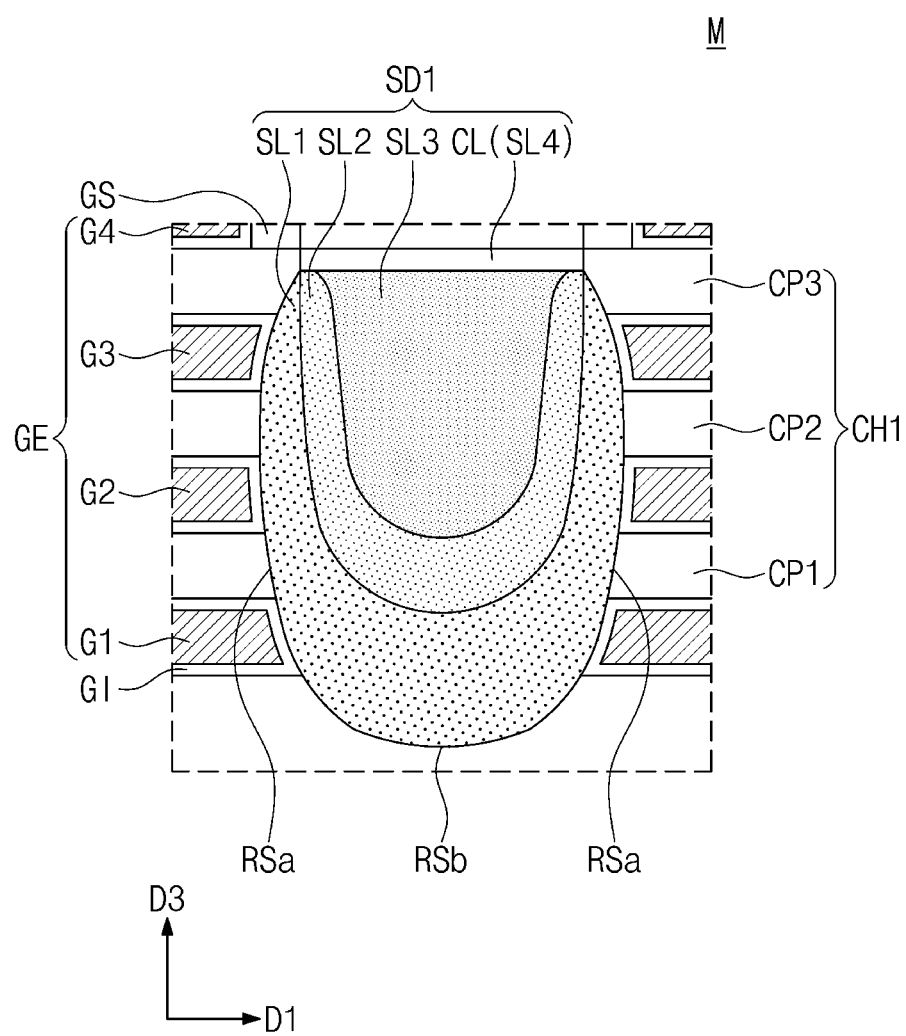
FIGS. 5 to 7 are enlarged sectional views illustrating a portion 'M' of FIG. 1.
Figure 6:
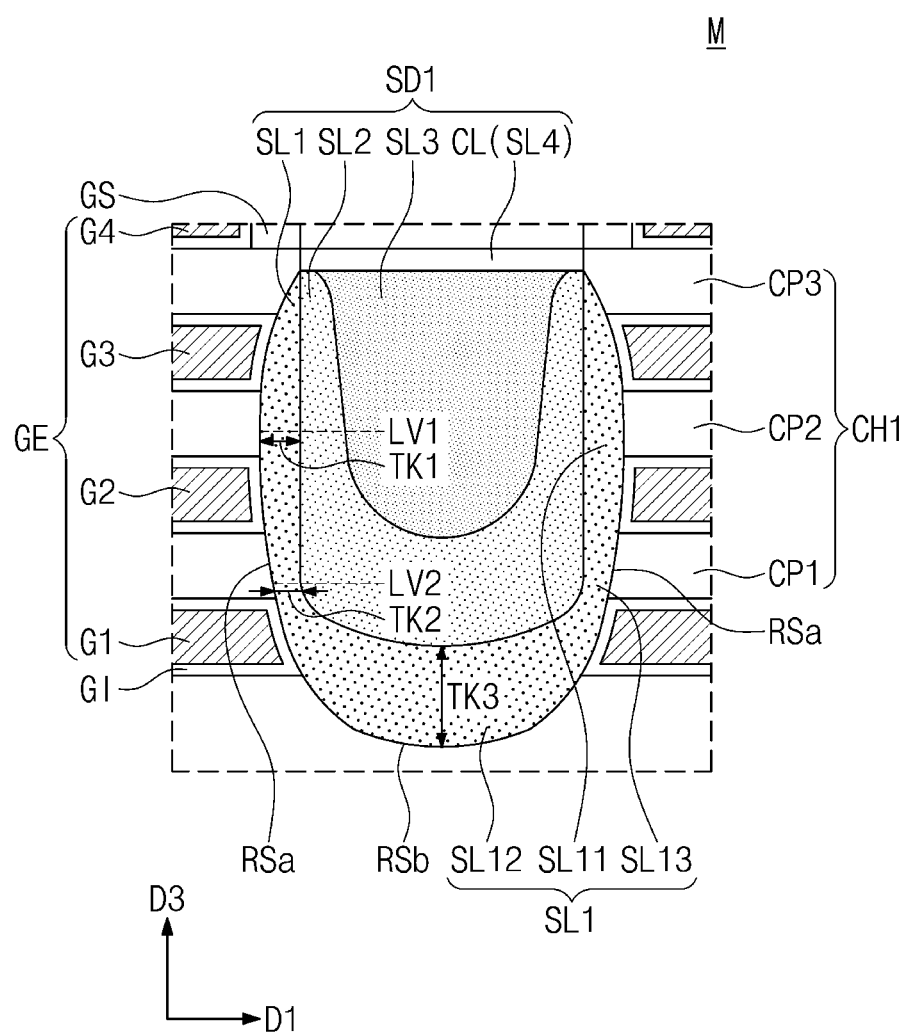
Figure 7:
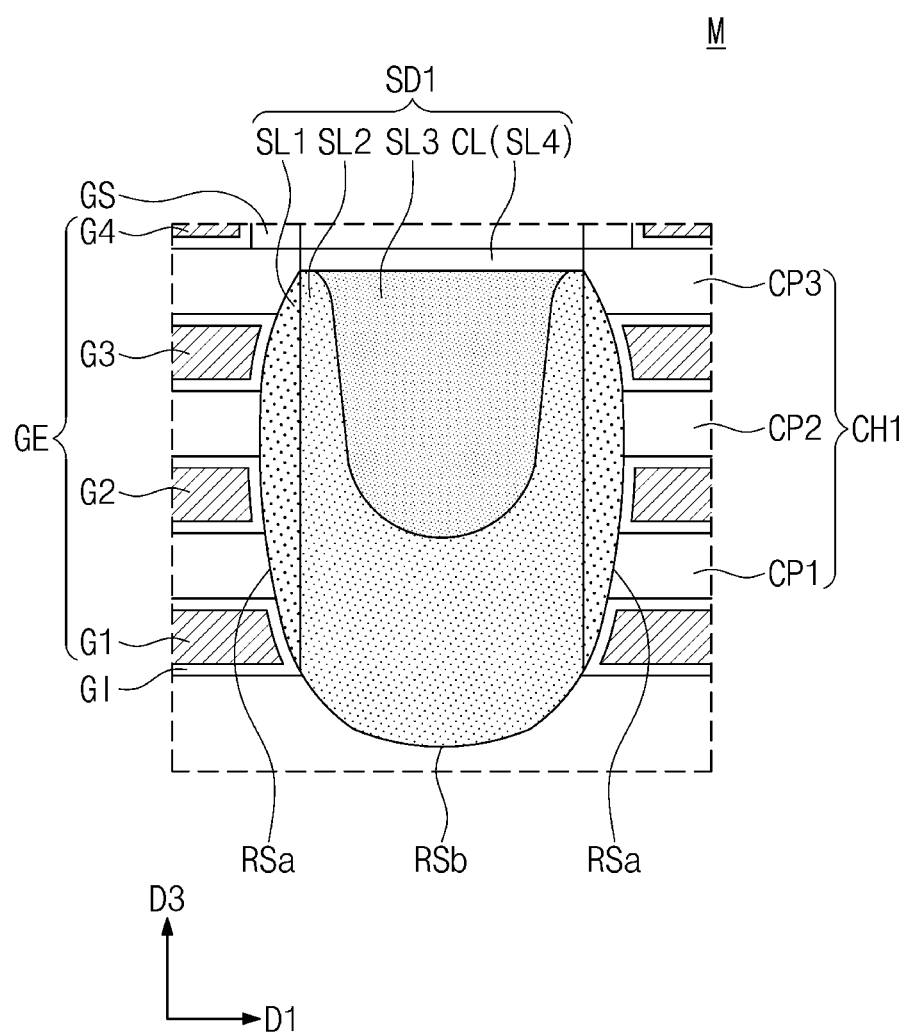
Figure 8:
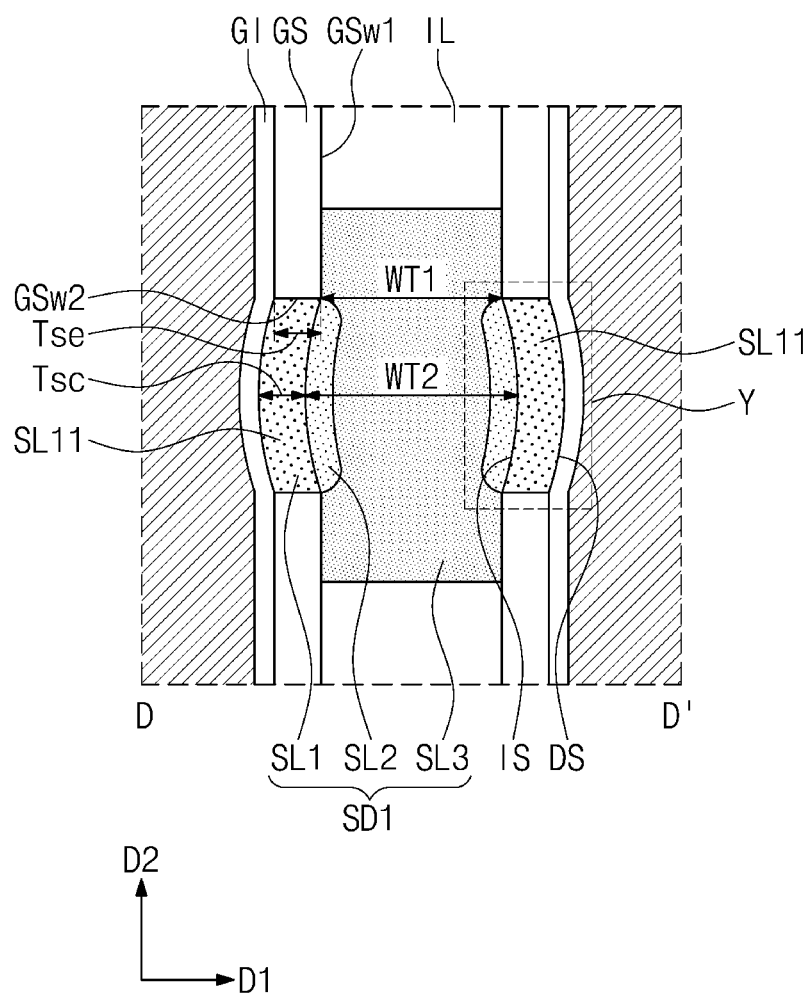
FIG. 8 is a sectional plan view taken along a line orthogonal to a line D-D' of FIG. 2.
Figure 9:
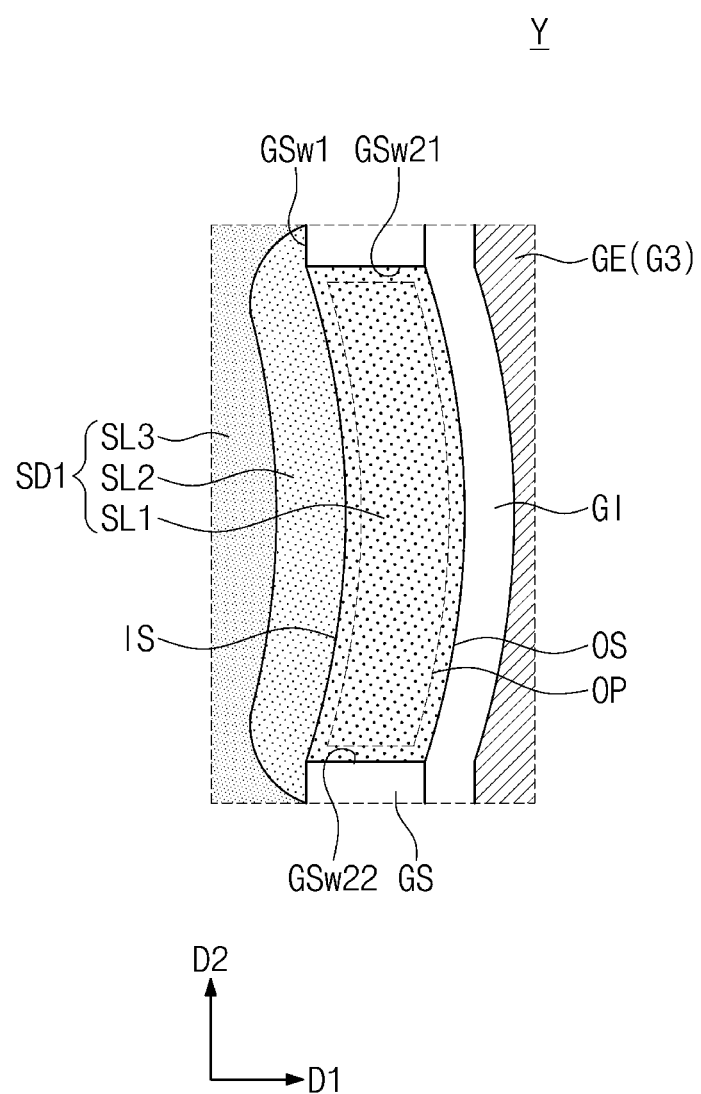
FIG. 9 is an enlarged sectional view illustrating a portion 'Y' of FIG. 8.

FIG. 1 is a plan view illustrating a semiconductor device according to an embodiment. FIGS. 2 to 4 are sectional views taken along lines A-A', B-B', and C-C', respectively, of FIG. 1. FIGS. 5 to 7 are enlarged sectional views illustrating a portion 'M' of FIG. 1. FIG. 8 is a sectional plan view taken along a line orthogonal to a line D-D' of FIG. 2. FIG. 9 is an enlarged sectional view illustrating a portion 'Y' of FIG. 8.

Referring to FIGS. 1 to 4, a substrate 100 including a first active region RG1 may be provided. The substrate 100 may be a semiconductor substrate (e.g., of silicon, germanium, or silicon-germanium) or a compound semiconductor substrate. In an implementation, the substrate 100 may be a silicon wafer.

In an implementation, the first active region RG1 may be a logic cell region, on which logic transistors constituting a logic circuit of the semiconductor device are disposed. In an implementation, the logic transistors constituting the logic circuit may be on the logic cell region of the substrate 100. Some of the logic transistors may be on the first active region RG1. The first active region RG1 may be a PMOSFET region or an NMOSFET region. In an implementation, the substrate 100 may further include a second active region RG2 (see FIG. 28). In the case where the first active region RG1 is the PMOSFET region, the second active region RG2 may be the NMOSFET region, and in the case where the first active region RG1 is the NMOSFET region, the second active region RG2 may be the PMOSFET region.

A second trench TR2 may be formed in an upper portion of the substrate 100 to define the first active region RG1. The first active region RG1 may extend (e.g., lengthwise) in a first direction D1 crossing a second direction D2. First active patterns AP1 may be provided on the first active region RG1. The first active patterns AP1 may extend in the second direction D2 and may be parallel to each other. The first active patterns AP1 may be portions of the substrate 100 protruding in a vertical direction. A first trench TR1 may be formed in an upper portion of the substrate 100 to define the first active patterns AP1. The first trench TR1 may be shallower than the second trench TR2.

A device isolation layer ST may fill the first and second trenches TR1 and TR2. The device isolation layer ST may be formed of or include silicon oxide. Upper portions of the first active patterns AP1 may have a shape vertically protruding above (e.g., in a vertical third direction D3) the device isolation layer ST (e.g., see FIG. 4). Each of top surfaces of the first active patterns AP1 may be flat. The device isolation layer ST may not cover the top surfaces of the first active patterns AP1. The device isolation layer ST may cover lower sidewalls of the first active patterns AP1.

First source/drain patterns SD1 may be on the first active patterns AP1. The first source/drain patterns SD1 may be impurity regions of a first conductivity type (e.g., p-type). Recesses RS may be formed on the first active pattern AP1, and the first source/drain patterns SD1 may be respectively provided to fill the recesses RS of the first active pattern AP1. First channel patterns CH1 may be on the first active patterns AP1. Each of the first channel patterns CH1 may be between adjacent pairs of the first source/drain patterns SD1. The first channel patterns CH1 may connect an adjacent pair of the first source/drain patterns SD1 to each other. The first channel pattern CH1 may include a plurality of semiconductor patterns CP1, CP2, and CP3. The semiconductor patterns may include, e.g., a first semiconductor pattern CP1, a second semiconductor pattern CP2, and a third semiconductor pattern CP3, which are vertically stacked. The first to third semiconductor patterns CP1, CP2, and CP3 may be spaced apart from each other in the third direction D3 that is perpendicular to both of the first and second directions D1 and D2. The first to third semiconductor patterns CP1, CP2, and CP3 may be overlapped with each other, when viewed in a plan view (e.g., when viewed from above along the third direction D3).

The first source/drain patterns SD1 may be epitaxial patterns that are formed by a selective epitaxial growth process. In an implementation, top surfaces of the first source/drain patterns SD1 may be coplanar with top surfaces of the first channel patterns CH1. In an implementation, the top surfaces of the first source/drain patterns SD1 may be higher than the top surfaces of the first channel patterns CH1.

The first source/drain patterns SD1 may be formed of or include a semiconductor material (e.g., SiGe) having a lattice constant greater than that of the semiconductor substrate 100. Accordingly, the first source/drain patterns SD1 may exert a compressive stress on the first channel patterns CH1.

Gate electrodes GE may cross the first active patterns AP1 and may extend in the second direction D2. The gate electrodes GE may be spaced apart from each other in the first direction D1. The gate electrodes GE may be overlapped with the first channel patterns CH1, respectively, when viewed in a plan view.

Referring back to FIG. 4, the gate electrode GE may be on a top surface, at least one side surface, and a bottom surface of each of the first to third semiconductor patterns CP1, CP2, and CP3. In an implementation, the gate electrode may surround the top surface, the at least one side surface, and the bottom surface of each of the semiconductor patterns CP1, CP2, and CP3. A transistor according to the present embodiment may be a three-dimensional field-effect transistor (e.g., a multi-bridge channel field-effect transistor (MBCFET)), in which the gate electrode GE three-dimensionally surrounds the channel pattern CH1 or CH2.

Referring back to FIGS. 1 to 4, a pair of gate spacers GS may be on both side surfaces of each of the gate electrodes GE. The gate spacers GS may extend along the gate electrodes GE and in the second direction D2. Top surfaces of the gate spacers GS may be higher than those of the gate electrodes GE (e.g., may be farther from the substrate 100 in the third direction D3). The top surfaces of the gate spacers GS may be coplanar with a top surface of a first interlayer insulating layer 110, which will be described below. The gate spacers GS may include, e.g., SiCN, SiCON, or SiN. In an implementation, the gate spacers GS may be a multi-layered structure including at least two of SiCN, SiCON, or SiN. As used herein, the term "or" is not an exclusive term, e.g., "A or B" would include A, B, or A and B.

A gate capping pattern GP may be on each of the gate electrodes GE. The gate capping pattern GP may extend along the gate electrode GE and in the second direction D2. The gate capping pattern GP may be formed of or include a material having an etch selectivity with respect to first and second interlayer insulating layers 110 and 120 to be described below. In an implementation, the gate capping patterns GP may be formed of or include, e.g., SiON, SiCN, SiCON, or SiN.

A gate dielectric pattern GI may be between the gate electrode GE and the first active pattern AP1. The gate dielectric pattern GI may extend along the gate electrode GE in the second direction D2. The gate dielectric pattern GI may surround each of the first channel patterns CH1. The gate dielectric pattern GI may cover the first channel pattern CH1. The gate dielectric pattern GI may cover a top surface of the device isolation layer ST (e.g., see FIG. 4).

In an implementation, the gate dielectric pattern GI may be formed of or include a high-k dielectric material, whose dielectric constant is higher than that of a silicon oxide layer. In an implementation, the high-k dielectric material may include, e.g., hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an implementation, the gate dielectric pattern GI may be formed of or include a ferroelectric material. The gate dielectric pattern GI including the ferroelectric material may serve as a negative capacitor. In an implementation, owing to movement of dipoles in the ferroelectric material which occurs when an external voltage is applied to the ferroelectric material, a negative capacitance effect, in which a phase of the ferroelectric material is changed to a state different from its initial polarization state, may occur. In this case, a total capacitance of a transistor including the ferroelectric material may be increased, and this may make it possible to improve sub-threshold swing characteristics of the transistor and to reduce an operation voltage.

The gate electrode GE may include a first metal pattern and a second metal pattern on the first metal pattern. The first metal pattern may be on the gate dielectric pattern GI and may be adjacent to the first and second channel patterns CH1 and CH2. The first metal pattern may include a work function metal, which may be used to adjust a threshold voltage of the transistor. By adjusting a thickness and composition of the first metal pattern, it may be possible to realize a transistor having a desired threshold voltage.

The first metal pattern may include a metal nitride layer. In an implementation, the first metal pattern may include nitrogen and may also include titanium (Ti), tantalum (Ta), aluminum (Al), tungsten (W), or molybdenum (Mo). In an implementation, the first metal pattern may further include carbon (C). The first metal pattern may include a plurality of work function metal layers, which are stacked.

The second metal pattern may include a metallic material, whose resistance is lower than the first metal pattern. In an implementation, the second metal pattern may include, e.g., tungsten (W), aluminum (Al), titanium (Ti), and tantalum (Ta).

The first interlayer insulating layer 110 may be on the substrate 100. The first interlayer insulating layer 110 may cover the gate spacers GS and the first source/drain patterns SD1. A top surface (e.g., surface facing away from the substrate 100 in the third direction D3) of the first interlayer insulating layer 110 may be substantially coplanar with the top surfaces of the gate capping patterns GP and the top surfaces of the gate spacers GS. The second interlayer insulating layer 120 may be on the first interlayer insulating layer 110 to cover the gate capping patterns GP. A third interlayer insulating layer 130 may be on the second interlayer insulating layer 120. In an implementation, the first to third interlayer insulating layers 110, 120, and 130 may be formed of or include silicon oxide.

Active contacts AC may penetrate the first and second interlayer insulating layers 110 and 120 and may be electrically connected to the first source/drain patterns SD1, respectively. Each of the active contacts AC may be between a pair of the gate electrodes GE.

The active contact AC may be a self-aligned contact. In an implementation, the active contact AC may be formed, in a self-alignment manner, using the gate capping pattern GP and the gate spacer GS. In an implementation, the active contact AC may cover at least a portion of a side surface of the gate spacer GS. In an implementation, the active contact AC may cover a portion of the top surface of the gate capping pattern GP.

A silicide pattern SC may be between the active contact AC and the first source/drain pattern SD1 and between the active contact AC and a second source/drain pattern SD2. The active contact AC may be electrically connected to the source/drain patterns SD1 and SD2 via the silicide pattern SC. The silicide pattern SC may be formed of or include a metal-silicide material (e.g., titanium-silicide, tantalum-silicide, tungsten-silicide, nickel-silicide, or cobalt-silicide). In an implementation, at least one gate contact may penetrate the second interlayer insulating layer 120 and the gate capping pattern GP and may be electrically connected to the gate electrode GE.

Each of the active and gate contacts AC and GC may include a conductive pattern FM and a barrier pattern BM enclosing the conductive pattern FM. In an implementation, the conductive pattern FM may include a metallic material (e.g., aluminum, copper, tungsten, molybdenum, or cobalt). The barrier pattern BM may cover side and bottom surfaces of the conductive pattern FM. The barrier pattern BM may include a metal layer or a metal nitride layer. The metal layer may include titanium, tantalum, tungsten, nickel, cobalt, or platinum. The metal nitride layer may include titanium nitride (TiN), tantalum nitride (TaN), tungsten nitride (WN), nickel nitride (NiN), cobalt nitride (CoN), or platinum nitride (PtN).

A first interconnection layer may be in the third interlayer insulating layer 130. The first interconnection layer may include a plurality of interconnection lines IL and a plurality of vias VI below the interconnection lines IL (e.g., the vias VI may be between the interconnection lines IL and the substrate 100 in the third direction D3). The interconnection lines IL may extend in the second direction D2 and may be parallel to each other. The interconnection lines IL may be arranged (e.g., spaced apart from one another) in the first direction D1.

The via VI may be between a first interconnection line, which is one of the interconnection lines IL, and the active contact AC. The first interconnection line may be electrically connected to the active contact AC through the via VI. The via VI may also be between a second interconnection line, which is another of the interconnection lines IL, and the gate contact GC. The second interconnection line may be electrically connected to the gate contact GC through the via VI.

In an implementation, a plurality of interconnection layers may be additionally stacked on the first interconnection layer. Logic cells may be connected to each other through the first interconnection layer and the additionally-stacked interconnection layers to constitute the logic circuit.

Hereinafter, the first source/drain pattern SD1 will be described in more detail with reference to FIGS. 5 to 9, along with FIGS. 1 to 4.

FIGS. 5 to 7 are enlarged sectional views illustrating a portion 'M' of FIG. 1. FIG. 8 is a sectional plan view taken along a line orthogonal to a line D-D' of FIG. 2 (e.g., FIG. 8 is a sectional plan view taken along a line in the third direction D3 and orthogonal to the line D-D'). FIG. 9 is an enlarged sectional view illustrating a portion 'Y' of FIG. 8. The recess RS may be formed on the first active pattern AP1. The recess RS may be between an adjacent pair of the first channel patterns CH1. The first source/drain pattern SD1 may be in the recess RS.

A sectional shape of the first source/drain pattern SD1 in the second direction D2 will be described with reference to FIGS. 5 to 7, along with FIG. 9. Here, the section in the second direction D2 may mean a section that is perpendicular to the second direction D2. The recess RS may include a pair of inner side surfaces RSa, which are opposite to each other, and a bottom surface RSb, which is between the pair of the inner side surfaces RSa to connect the pair of the inner side surfaces RSa to each other. The recess RS may expose a side surface of the first channel pattern CH1. Due to the presence of the recess RS, the gate electrode GE may have an opening OP exposing the first channel pattern CH1 (e.g., see FIG. 9). The gate spacer GS may include a first spacer sidewall GSw1, which is exposed in the first direction D1, and a second spacer sidewall GSw2, which corresponds to an inner side surface of the opening OP and is exposed in the second direction D2.

Referring to FIG. 5, the first source/drain pattern SD1 may include a buffer layer SL1, an intermediate layer SL2 on the buffer layer SL1, a main layer SL3 on the intermediate layer SL2, and a capping layer CL on the main layer SL3. In an implementation, the buffer layer SL1 may cover the pair of inner side surfaces RSa and the bottom surface RSb of the recess RS. When viewed in the second direction D2, the buffer layer SL1 may have a 'U'-shaped section. In an implementation, the buffer layer SL1 may include a pair of side portions, which are on the inner side surfaces RSa, and a center portion, which is on the bottom surface RSb. The intermediate layer SL2 may be on the buffer layer SL1 to cover inner surfaces, e.g., inner side surfaces and a bottom surface of the buffer layer SL1. The buffer layer SL1 may have a 'U'-shaped section, when viewed in the second direction D2.

The main layer SL3 may be on the intermediate layer SL2 to cover inner surfaces, e.g., an inner side surface, of the intermediate layer SL2. The main layer SL3 may fill a remaining space of the recess RS. A top surface of the main layer SL3 may be substantially coplanar with or lower than (e.g., closer to the substrate 100 in the third direction D3 than) a top surface of the third semiconductor pattern CP3.

The capping layer CL may be on the main layer SL3. The capping layer CL may cover an exposed surface of the main layer SL3. The capping layer CL may be conformally formed on the exposed surface of the main layer SL3. The capping layer CL may help protect the main layer SL3.

Each of the buffer layer SL1, the intermediate layer SL2, and the main layer SL3 may be formed of or include a semiconductor material whose lattice constant is greater than a lattice constant of a semiconductor element of the substrate 100. In the case where the substrate 100 includes silicon (Si), the buffer layer SL1, the intermediate layer SL2, and the main layer SL3 may be formed of or include silicon-germanium (SiGe). The lattice constant of the germanium (Ge) may be greater than the lattice constant of the silicon (Si).

In an implementation, the buffer layer SL1 may contain a relatively low concentration of germanium (Ge). In an implementation, a concentration of germanium (Ge) in the buffer layer SL1 may range from 10 at % to 20 at %. A concentration of germanium (Ge) in the intermediate layer SL2 may be higher than the concentration of germanium (Ge) in the buffer layer SL1. The concentration of germanium (Ge) in the intermediate layer SL2 may range from 30 at % to 40 at %. The main layer SL3 may contain a relatively high concentration of germanium (Ge). A concentration of germanium (Ge) in the main layer SL3 may be higher than the concentration of germanium (Ge) in the intermediate layer SL2. The concentration of germanium (Ge) in the main layer SL3 may range from 60 at % to 80 at %. The buffer layer SL1, the intermediate layer SL2, and the main layer SL3 may contain impurities (e.g., boron), allowing the first source/drain pattern SD1 to have a p-type.

The buffer layer SL1 and the intermediate layer SL2 may help prevent a stacking fault between the substrate 100 and the main layer SL3. If a stacking fault were to occur, a channel resistance could be increased. The stacking fault may be most frequently produced on the bottom surface RSb of the recess RS. In an effort to help reduce the possibility of or prevent the stacking fault, a third thickness of a center portion of the buffer layer SL1 should be larger than a specific value. If the thickness of the buffer layer SL1 were to be increased to help prevent the stacking fault, a volume of the main layer SL3 filling the recess RS may be reduced. If the volume of the main layer SL3 were to be decreased, the performance of the PMOSFET may be deteriorated.

Referring to FIG. 6, the first source/drain pattern SD1 may include the buffer layer SL1, the intermediate layer SL2 on the buffer layer SL1, the main layer SL3 on the intermediate layer SL2, and the capping layer CL on the main layer SL3. For concise description, an element previously described with reference to FIG. 5 may be identified by the same reference number without repeating an overlapping description thereof.

In an implementation, the buffer layer SL1 may cover a pair of the inner side surfaces RSa and the bottom surface RSb of the recess RS. When viewed in the second direction D2, the buffer layer SL1 may have a 'U'-shaped section. In detail, the buffer layer SL1 may include a pair of side portions SL11 on the inner side surfaces RSa, a center portion SL12 on the bottom surface RSb, and an edge portion SL13 connecting the side portions SL11 to the center portion SL12.

The side portions SL11 may have a first thickness TK1 in the first direction D1 measured at a first level LV1 (e.g., measured at a first distance from the substrate 100 in the third direction D3). The side portions SL11 may have a maximum width in the first direction D1 at the first level LV1. The edge portion SL13 may have a second thickness TK2 in the first direction D1 and at a second level LV2. The first level LV1 may be higher (e.g., farther from the substrate 100 in the third direction D3) than the second level LV2, and the first thickness TK1 may be greater than the second thickness TK2.

The center portion SL12 may have a third thickness TK3 in the third direction D3. The third thickness TK3 may be adjusted by changing the etching process condition. In an implementation, the third thickness TK3 may be 5% to 40% of the total height of the recess RS.

The intermediate layer SL2 may be on the inner side surface of the buffer layer SL1. The intermediate layer SL2 may cover the inner side surface and the bottom surface of the buffer layer SL1. When viewed in or along the second direction D2 (e.g., as illustrated in FIG. 6), the intermediate layer SL2 may have a 'U'-shaped section. A thickness of the intermediate layer SL2 may increase with decreasing distance to the bottom surface RSb of the recess RS (e.g., a portion of the intermediate layer SL2 proximate to the bottom surface RSb of the recess RS may be thicker than a portion of the intermediate layer SL2 distal to the bottom surface RSb of the recess RS).

The main layer SL3 may be on the intermediate layer SL2 to cover the inner side surface of the intermediate layer SL2. The capping layer CL may be on the main layer SL3. The main layer SL3 and the capping layer CL may have substantially the same features as those described with reference to FIG. 5.

In an implementation, referring to FIG. 7, the first source/drain pattern SD1 may include the buffer layer SL1, the intermediate layer SL2 on the buffer layer SL1, the main layer SL3 on the intermediate layer SL2, and the capping layer CL on the main layer SL3. For concise description, an element previously described with reference to FIGS. 5 and 6 may be identified by the same reference number without repeating an overlapping description thereof.

In an implementation, the buffer layer SL1 may cover a pair of the inner side surfaces RSa of the recess RS (e.g., and may not cover the bottom surface RSb of the recess RS). When viewed in the second direction D2, the buffer layer SL1 may have a section that is shaped like a '11'. In an implementation, the buffer layer SL1 may include a pair of side portions on the inner side surfaces RSa and may expose or not cover the bottom surface RSb of the recess RS. The side portions may be spaced apart from each other in the first direction D1. The side portions may cover the inner side surfaces RSa and may not cover the bottom surface RSb. The inner side surface of the side portions may be vertically aligned to or with the side surface of the gate spacer GS.

The intermediate layer SL2 may cover the inner side surfaces of the buffer layer SL1 and the bottom surface RSb of the recess RS. A thickness of the intermediate layer SL2 may increase with decreasing distance to the bottom surface RSb. The main layer SL3 may be on the intermediate layer SL2 to fill a remaining space of the recess RS. The capping layer CL may be on the main layer SL3. The main layer SL3 and the capping layer CL may have substantially the same features as those described with reference to FIG. 5.

Referring to FIGS. 8 and 9, as a result of the formation of the recess RS, the gate spacer GS may have the opening OP (e.g., therein). In an implementation, the gate spacer GS may have the first spacer sidewall GSw1, which is exposed in or faces the first direction D1, and may have the second spacer sidewall GSw2, which corresponds to the inner sidewall of the opening OP and is exposed in or faces the second direction D2.

The buffer layer SL1 (e.g., the pair of side portions SL11) may fill the opening OP. In an implementation, the buffer layer SL1 may fully cover the second spacer sidewall GSw2. The buffer layer SL1 may include an outer side surface OS and an inner side surface IS, which are opposite to each other, and each of the outer and inner side surface OS and IS may be convexly curved toward the gate electrode GE that is most adjacent or closest to the buffer layer SL1. The inner side surface IS may be connected to or continuous with the first spacer sidewall GSw1.

The buffer layer SL1 may have a sidewall center thickness Tsc at a center of the opening OP and a sidewall edge thickness Tse at an edge of the opening OP, when viewed in a plan view. The sidewall center thickness Tsc may be equal to the sidewall edge thickness Tse. When viewed in a plan view, the side portions SL11 may have or be spaced apart a second distance WT2 at the center of the opening OP and in the first direction D1. The side portions SL11 may be spaced apart from each other by a first distance WT1, when measured in the first direction D1, at an edge portion of the opening OP adjacent to the gate spacer GS. The outer side surface OS and the inner side surface IS may be convexly curved toward the gate electrode GE, and the second distance WT2 may be larger than the first distance WT1.

The intermediate layer SL2 may be on the inner side surface IS of the buffer layer SL1 In an implementation, as shown in FIG. 9, the intermediate layer SL2 may cover the inner side surface IS of the buffer layer SL1 and may cover a portion of the first spacer sidewall GSw1 adjacent to the opening OP. Referring back to FIG. 8, the main layer SL3 may be between a pair of the side portions SL11. The main layer SL3 may cover the intermediate layer SL2 and at least a portion of the first spacer sidewall GSw1 and may be spaced apart from the second spacer sidewall GSw2.

If, when viewed in a plan view, the thickness of the buffer layer SL1 filling the opening OP were to decrease with decreasing distance from the edge of the opening OP, a leakage current could be produced between the gate electrode GE and the first source/drain pattern SD1, and this could lead to deterioration in reliability of the semiconductor device. According to an embodiment, the side portions SL11 of the buffer layer SL1 may be formed by filling the entire region of the recess RS with the buffer layer SL1 and performing an etching process. Accordingly, when viewed in a plan view, each of the side portions SL11 may have a uniform thickness and may fully cover the first spacer sidewall GSw1 of the gate spacer GS adjacent thereto, and thus, it may be possible to prevent the leakage current. Accordingly, it may be possible to realize a semiconductor device with improved reliability.

Fabrication Method

FIGS. 10, 13, 16, 19, and 22 are plan views illustrating stages in a method of fabricating a semiconductor device, according to an embodiment. FIGS. 11, 14, 17, 20, and 23 are sectional views taken along lines A-A' of FIGS. 10, 13, 16, 19, and 22, respectively. FIGS. 12, 15, 18, 21, and 24 are sectional views taken along lines D-D' of FIGS. 11, 14, 17, 20, and 23, respectively.

Figure 10:
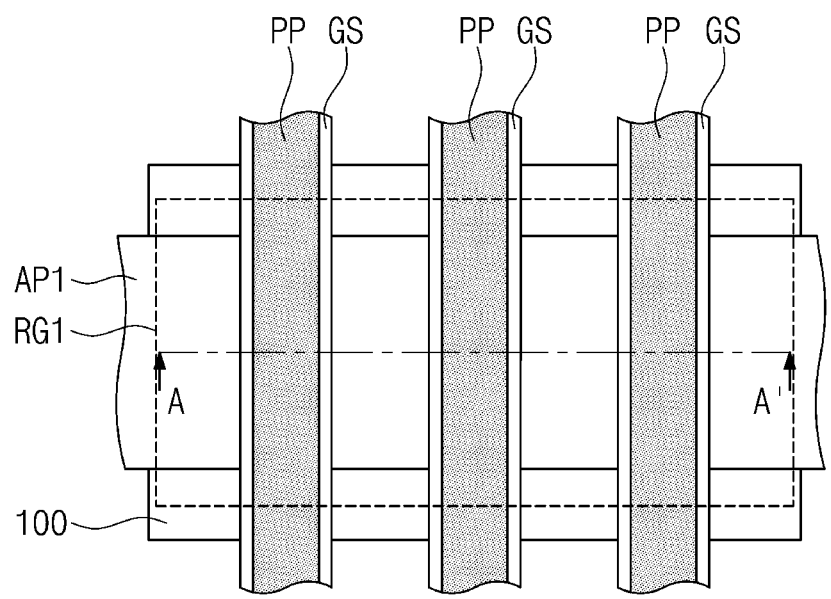
FIGS. 10, 13, 16, 19, and 22 are plan views of stages in a method of fabricating a semiconductor device, according to an embodiment.
Figure 10:
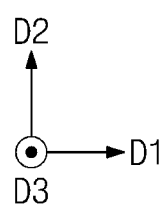
Figure 11:
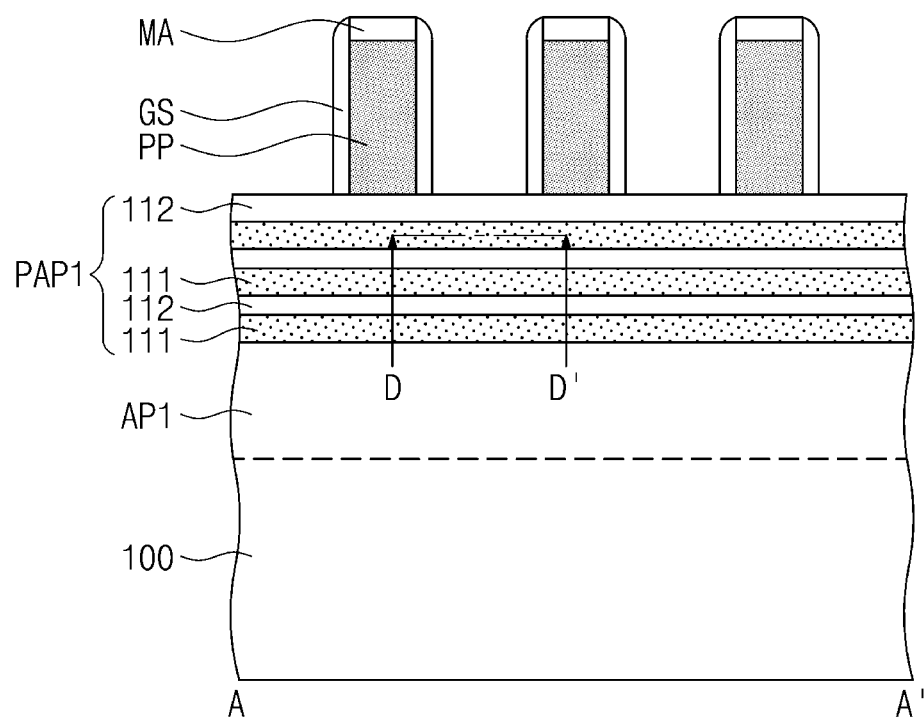
FIGS. 11, 14, 17, 20, and 23 are sectional views taken along lines A-A' of FIGS. 10, 13, 16, 19, and 22, respectively.
Figure 11:
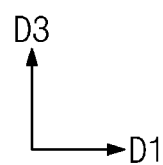
Figure 12:
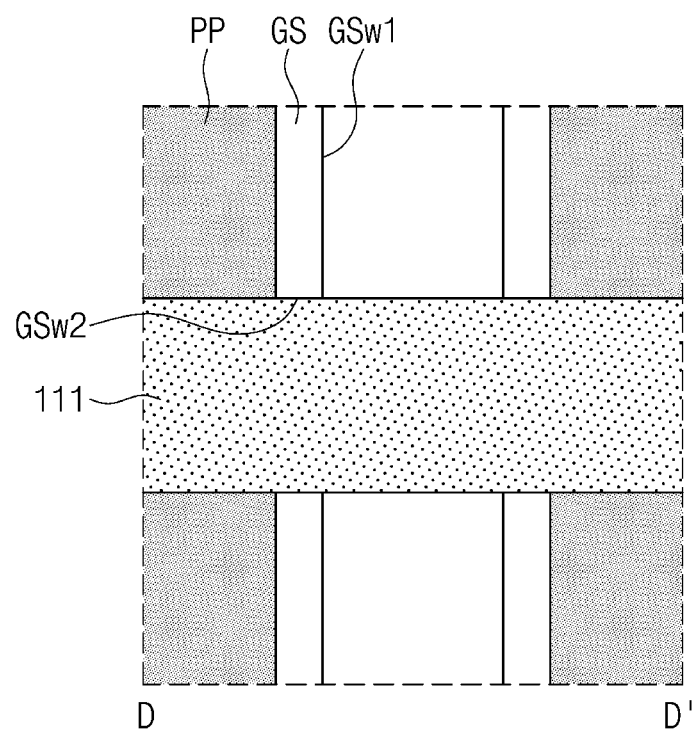
FIGS. 12, 15, 18, 21, and 24 are sectional views taken along lines D-D' of FIGS. 11, 14, 17, 20, and 23, respectively.
Figure 12:
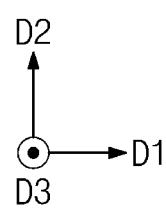

Referring to FIGS. 10 to 12 in conjunction with FIGS. 3 to 4, the substrate 100 including the first active region RG1 may be provided. Sacrificial layers 111 and semiconductor layers 112 may be alternately and repeatedly stacked on the substrate 100. In an implementation, as illustrated in FIG. 11, three semiconductor layers 112 may be alternately and repeatedly stacked on the substrate 100. The sacrificial layers 111 may be formed of or include a material having an etch selectivity with respect to the semiconductor layers 112. In an implementation, the semiconductor layers 112 may be formed of or include a material, which is not substantially etched during a process of etching the sacrificial layers 111. In an implementation, the sacrificial layers 111 may be formed of or include silicon-germanium (SiGe) or germanium (Ge), and the semiconductor layers 112 may be formed of or include silicon (Si).

Each of the sacrificial and semiconductor layers 111 and 112 may be formed by an epitaxial growth process using the substrate 100 as a seed layer. The sacrificial and semiconductor layers 111 and 112 may be successively formed in the same chamber. The sacrificial and semiconductor layers 111 and 112 may be conformally grown, on the substrate 100.

Next, the sacrificial and semiconductor layers 111 and 112 may be patterned to form a first preliminary pattern PAP1 on the first active region RG1 of the substrate 100. The patterning process may be performed to etch an upper portion of the substrate 100, and in this case, the first trench TR1 and the second trench TR2 may be formed in the upper portion of the substrate 100. The first trench TR1 may define the first active pattern AP1 of the substrate 100, and the second trench TR2 may define the first active region RG1 of the substrate 100.

First preliminary patterns PAP1, which are patterned, may be on the first active pattern AP1. The first preliminary pattern PAP1 may overlap the first active patterns AP1, respectively, when viewed in a plan view. The first preliminary pattern PAP1 and the first active pattern AP1 may be line-shaped or bar-shaped patterns extending in the first direction D1.

Sacrificial patterns PP may cross the first preliminary pattern PAP1. The sacrificial patterns PP may be line-shaped or bar-shaped patterns, which extend (e.g., lengthwise) in the second direction D2.

The formation of the sacrificial patterns PP may include forming a sacrificial layer on the substrate 100, forming mask patterns on the sacrificial layer, and etching the sacrificial layer using the mask patterns as an etch mask. The sacrificial layer may be formed of or include poly silicon. The mask patterns may be formed of or include silicon oxide, silicon nitride, or silicon oxynitride.

A pair of the gate spacers GS may be formed on both sidewalls of each of the sacrificial patterns PP. The gate spacers GS may be formed of or include SiCN, SiCON, or SiN. The formation of the gate spacers GS may include forming a spacer layer on the substrate 100 using a deposition process (e.g., CVD or ALD) and performing an anisotropic etching process on the spacer layer.

Figure 13:
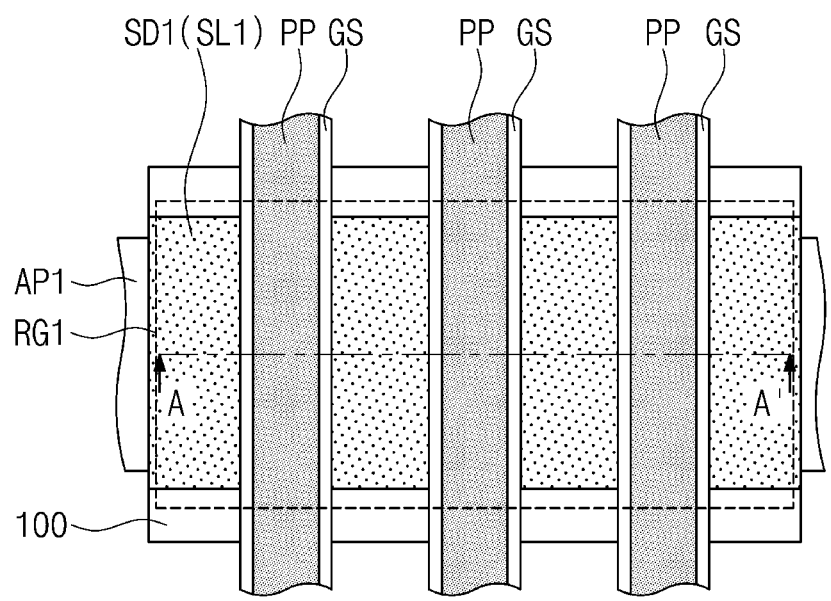
Figure 13:
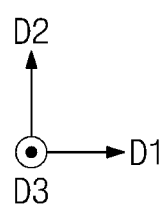
Figure 14:
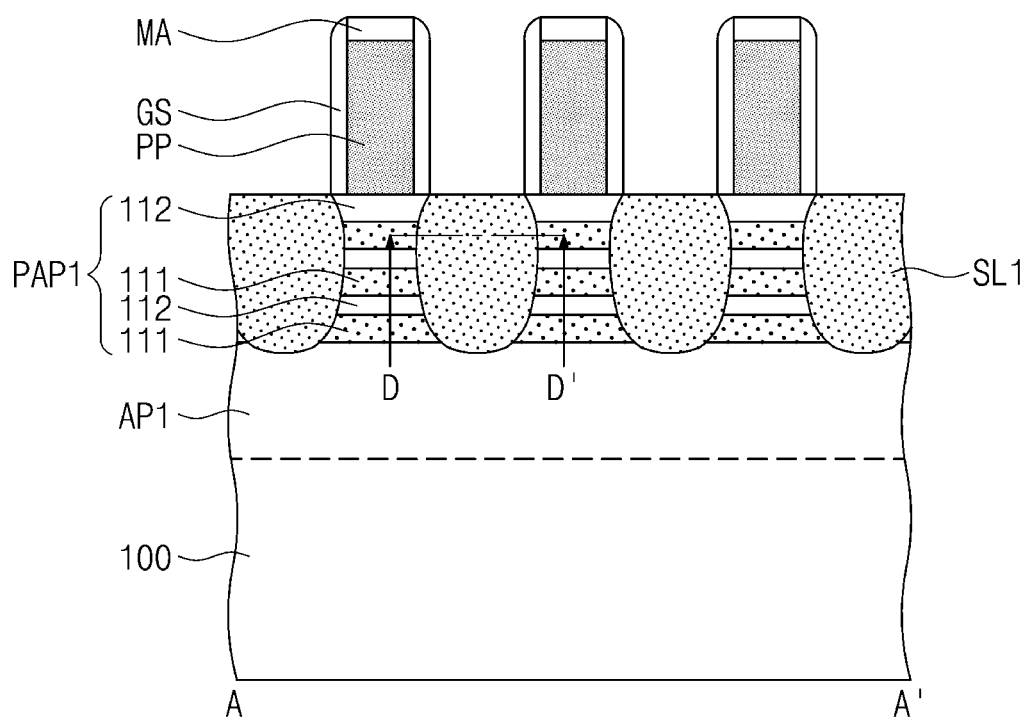
Figure 14:
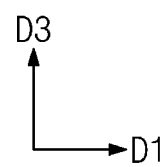
Figure 15:
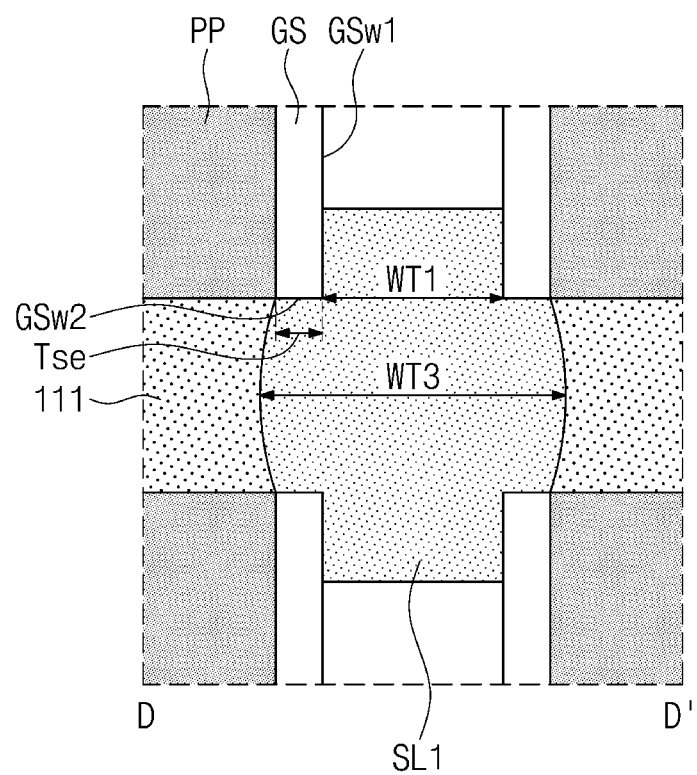

Referring to FIGS. 13 to 15, the first preliminary pattern PAP1 may be etched to form the recesses RS on the first active pattern AP1. In an implementation, a pair of the recesses RS may be formed at both sides of each of the sacrificial patterns PP. The formation of the recesses RS may include etching the first preliminary pattern PAP1 using hard mask patterns MA and the gate spacers GS as an etch mask.

The first source/drain pattern SD1 may be formed to fill the recesses RS. The first source/drain pattern SD1 may be formed of or include a second semiconductor material whose lattice constant is greater than a lattice constant of a first semiconductor material of the substrate 100. In an implementation, the first semiconductor element may be silicon (Si), and the second semiconductor element may be germanium (Ge). The first source/drain pattern SD1 may be formed of a plurality of stacked semiconductor layers.

In an implementation, the formation of the first source/drain pattern SD1 may include forming the buffer layer SL1 to fill the entire region of the recess, etching the buffer layer SL1 to form a temporary recess RS' (see FIG. 17), forming the intermediate layer SL2 on the etched buffer layer SL1 to cover the temporary recess RS', and forming the main layer SL3 to fill a remaining space of the recess RS.

The buffer layer SL1 may be formed by a first selective epitaxial growth process, in which an inner sidewall of the recess RS of the first active pattern AP1 is used as a seed layer. The first selective epitaxial growth process may include a chemical vapor deposition (CVD) process or a molecular beam epitaxy (MBE) process. The buffer layer SL1 may contain the second semiconductor element of a low concentration. The buffer layer SL1 may be doped to contain a low concentration of impurities. In an implementation, the buffer layer SL1 may include a silicon-germanium (SiGe) layer that is doped with boron (B). A concentration of germanium (Ge) in the buffer layer SL1 may range from 10 at % to 20 at %.

Referring to FIGS. 14 and 15, the buffer layer SL1 may be formed to cover a pair of the inner side surfaces and the bottom surface of the recess RS. The buffer layer SL1 may be formed to fill an inner space of the recess RS. A top surface of the buffer layer SL1 may be provided at substantially the same level as a top surface of the topmost layer of the semiconductor layers 112. The buffer layer SL1 may fill the opening of or in the gate spacer GS. In an implementation, the buffer layer SL1 may cover at least a portion of the first spacer sidewall GSw1 of the gate spacer GS and may fully cover the second spacer sidewall GSw2.

Figure 16:
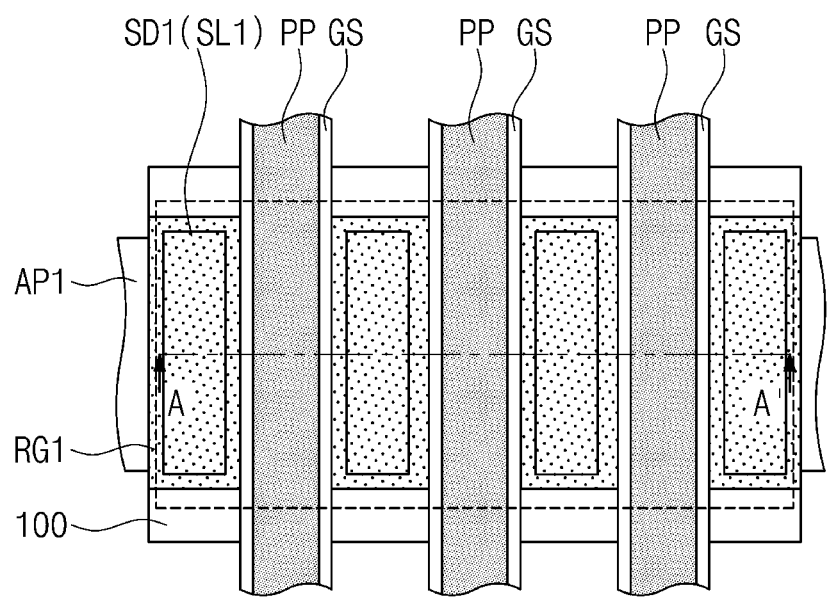
Figure 16:
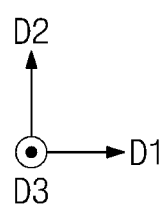
Figure 17:
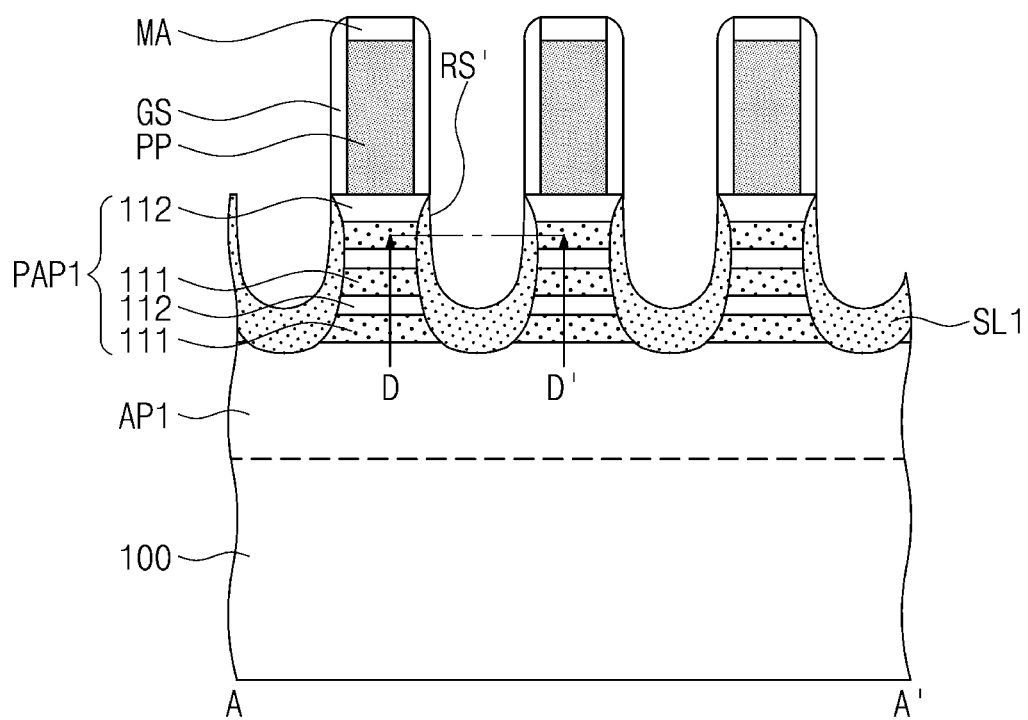
Figure 18:
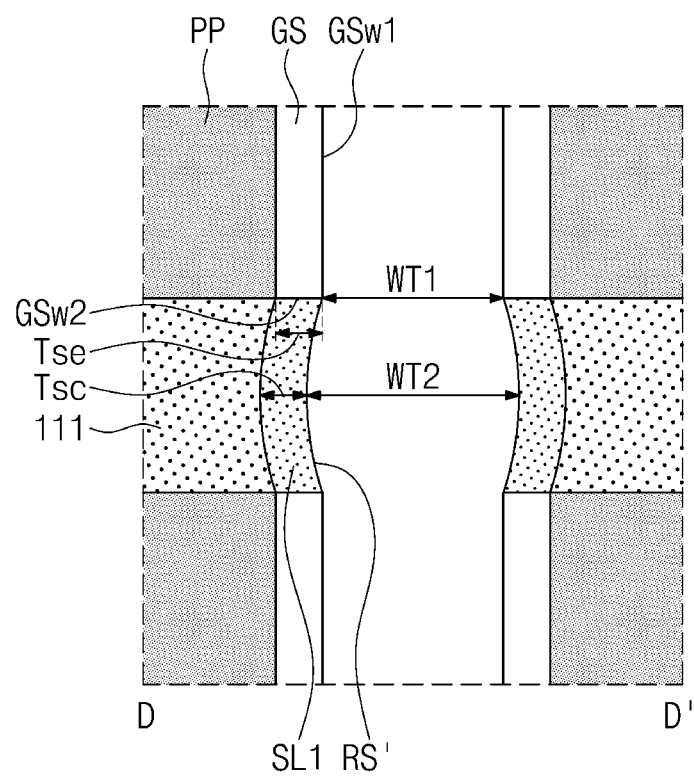

Referring to FIGS. 16 to 18, the temporary recess RS' may be formed by etching a portion of the buffer layer SL1. The temporary recess RS' may be formed by an etching process. The etching process may include a dry or wet etching process. The etching process may include etching the buffer layer SL1 using the gate spacer GS and hard mask pattern MA as an etch mask. Accordingly, the buffer layer SL1 may have a pair of inner side surfaces, which are opposite to each other, when viewed in a plan view.

Figure 19:
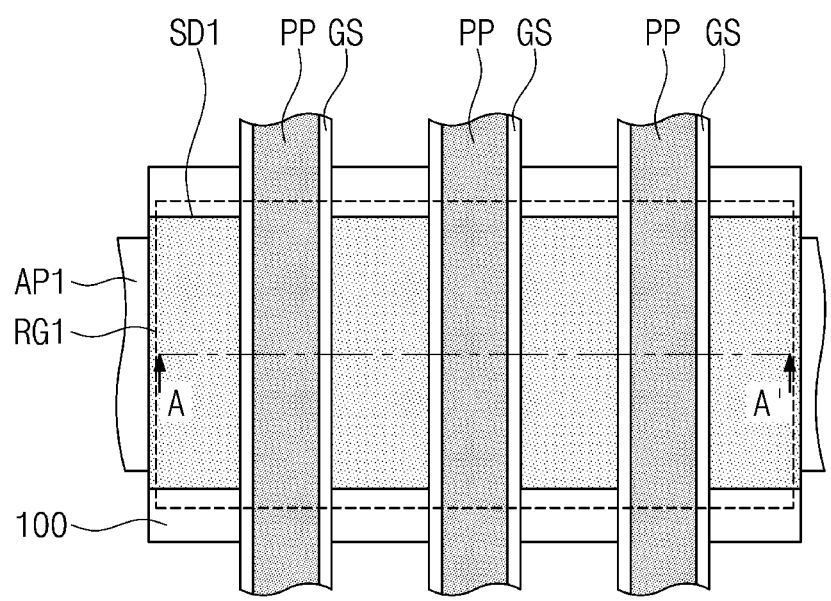
Figure 20:
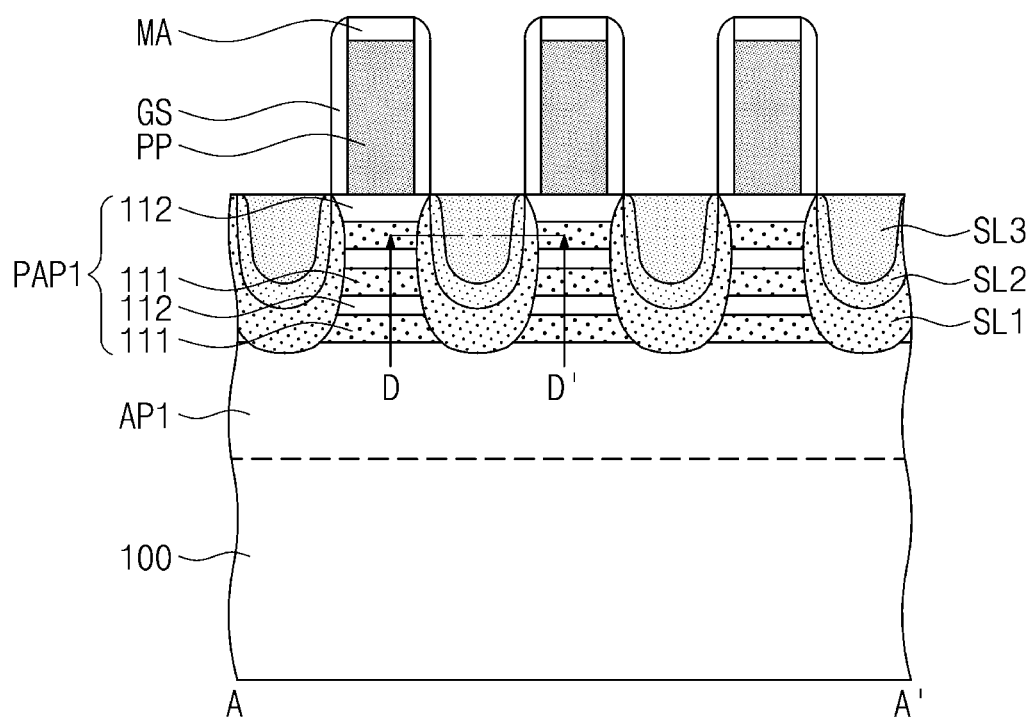
Figure 21:
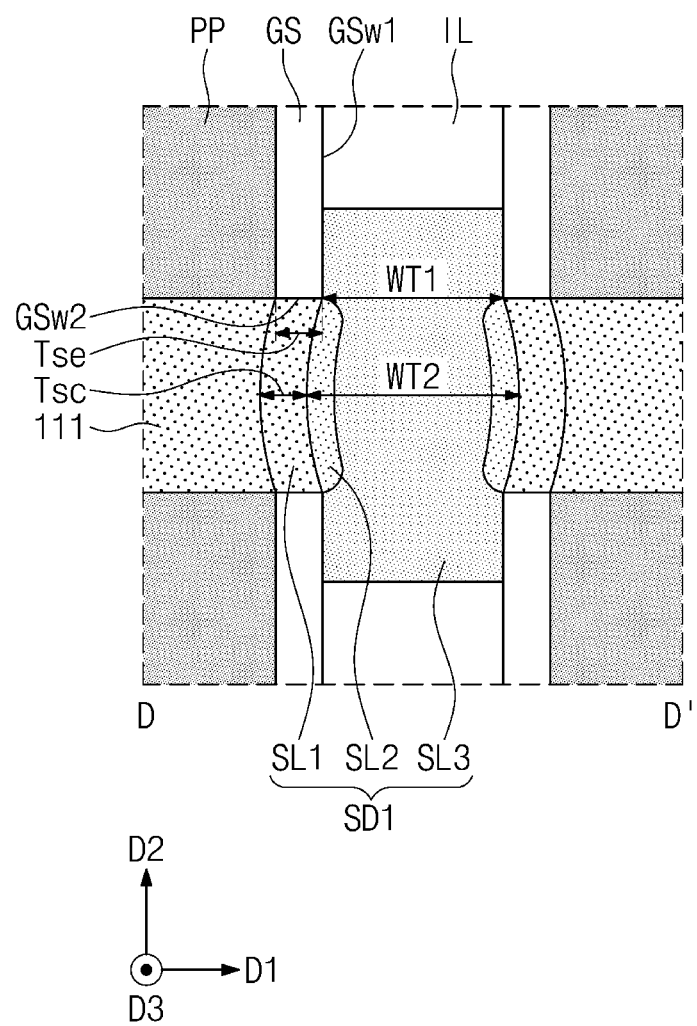

Referring to FIGS. 19 to 21, the intermediate layer SL2 and the main layer SL3 may be formed on the buffer layer SL1. The intermediate layer SL2 may be formed by a second selective epitaxial growth process, in which the buffer layer SL1 is used as a seed layer. The intermediate layer SL2 may cover inner side surfaces of the buffer layer SL1. A concentration of germanium in the intermediate layer SL2 may range from 30 at % to 40 at %. The main layer SL3 may be formed on the intermediate layer SL2.

The main layer SL3 may be formed by a third selective epitaxial growth process, in which the intermediate layer SL2 is used as a seed layer. The third selective epitaxial growth process may be performed under temperature condition lower than that in the first and second epitaxial growth processes. In an implementation, the third selective epitaxial growth process may be performed under the temperature condition of 300° C. to 900° C. The main layer SL3 may contain the second semiconductor element of a high concentration. A concentration of the second semiconductor element of the main layer SL3 may be higher than a concentration of the second semiconductor element of the buffer layer SL1. The main layer SL3 may be doped to have a doping concentration that is higher than those of the buffer layer SL1 and the intermediate layer SL2. In an implementation, the main layer SL3 may include a silicon-germanium (SiGe) layer that is doped with boron (B). The concentration of germanium (Ge) in the main layer SL3 may range from 60 at % to 80 at %.

The capping layer CL (see FIG. 23) may be formed by a third selective epitaxial growth process, in which the main layer SL3 is used as a seed layer. The capping layer CL may be formed to conformally cover the surface of the main layer SL3. The capping layer CL may contain a first semiconductor element that is the same element as those in the substrate 100. In an implementation, the capping layer CL may include single-crystalline silicon (Si). A concentration of silicon (Si) in the capping layer CL may range from 95 at % to 100 at %.

Figure 22:
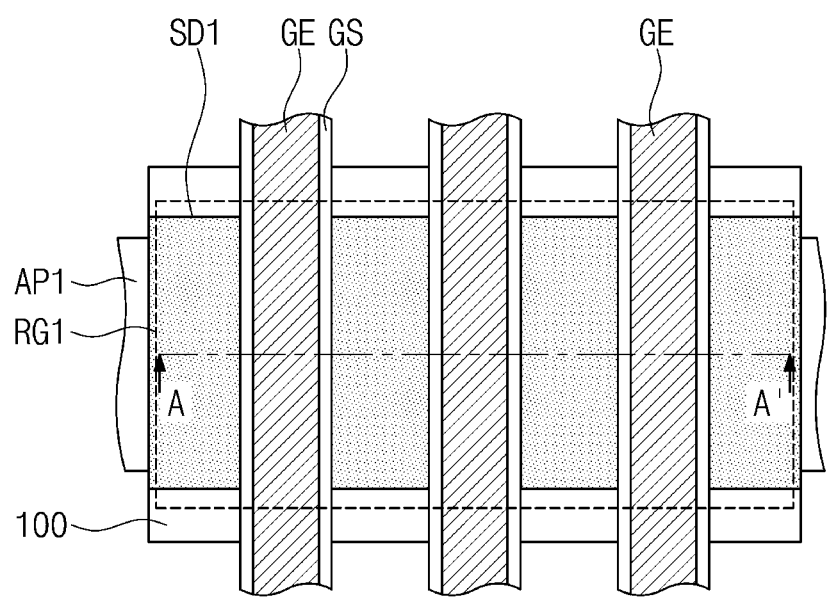
Figure 22:
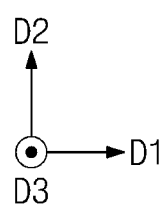
Figure 23:
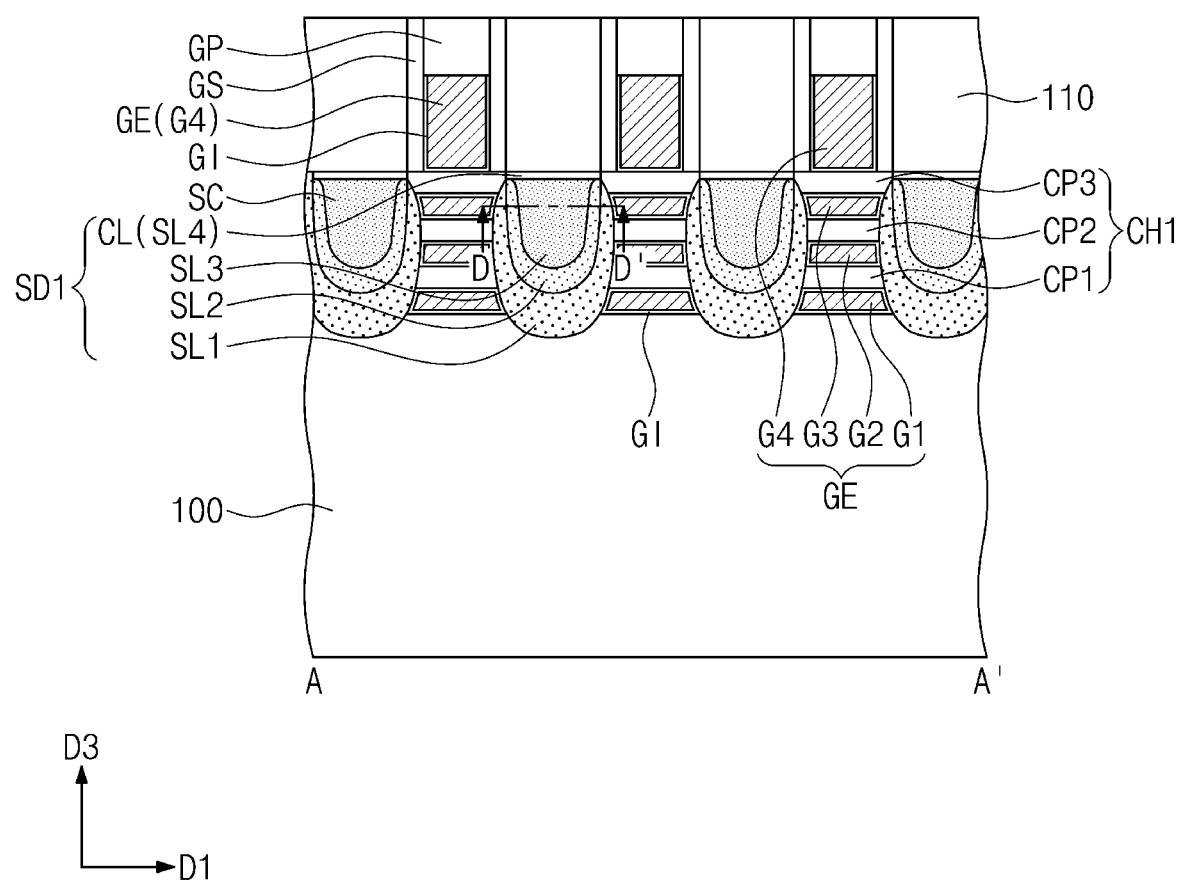
Figure 24:
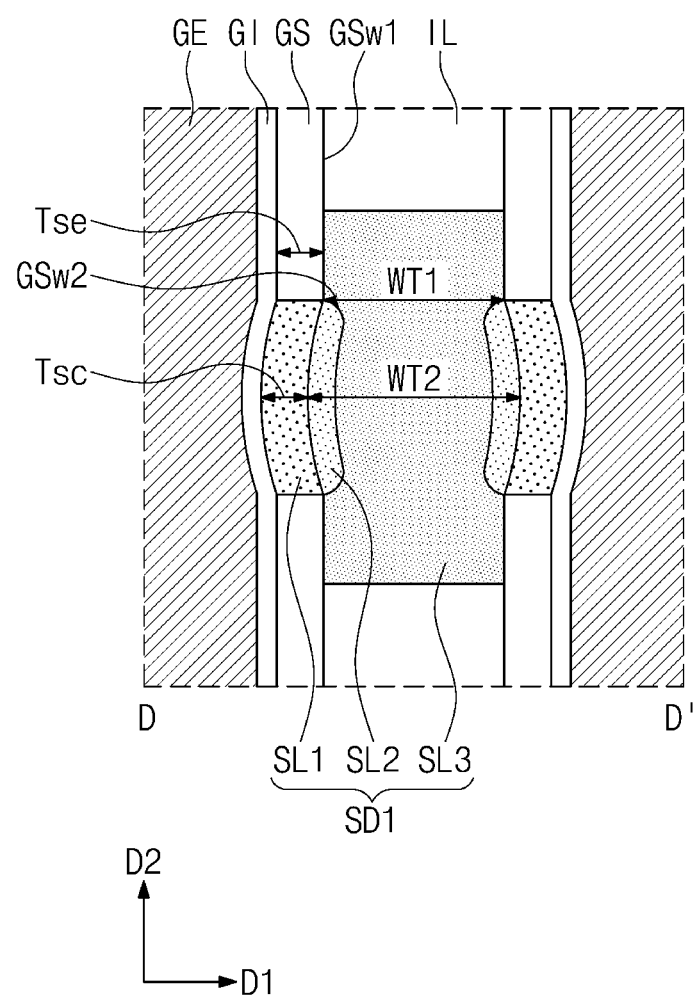

Referring to FIGS. 22 to 24, the first interlayer insulating layer 110 may be formed to cover the first source/drain patterns SD1, the gate spacers GS, and the mask patterns MA. In an implementation, the first interlayer insulating layer 110 may be formed of or include silicon oxide.

A planarization process may be performed on the first interlayer insulating layer 110 to expose the top surfaces of the sacrificial patterns PP. The planarization of the first interlayer insulating layer 110 may be performed using an etch-back or chemical-mechanical polishing (CMP) process. As a result, the first interlayer insulating layer 110 may have a top surface that is substantially coplanar with the top surfaces of the sacrificial patterns PP and the top surfaces of the gate spacers GS.

Each of the sacrificial patterns PP may be replaced with the gate electrode GE and the gate dielectric pattern GI. In an implementation, an empty space may be formed by selectively removing the exposed sacrificial patterns PP. The gate dielectric pattern GI may be formed in the empty space, which is formed by removing the sacrificial pattern PP. The gate electrode GE may be formed on the gate dielectric pattern GI to fill the empty space.

The gate dielectric pattern GI may be conformally formed by an atomic layer deposition (ALD) and/or a chemical oxidation process. The gate dielectric pattern GI may be formed of or include a high-k dielectric material. In an implementation, the gate dielectric pattern GI may be formed of or include a ferroelectric material.

The formation of the gate electrode GE may include forming a gate electrode layer on the gate dielectric pattern GI and planarizing the gate electrode layer. In an implementation, the gate electrode layer may include a first gate electrode layer including metal nitride and a second gate electrode layer including low resistance metal.

An upper portion of the gate electrode GE may be selectively etched to recess the gate electrode GE. The recessed top surface of the gate electrode GE may be lower than the top surface of the first interlayer insulating layer 110 and the top surfaces of the gate spacers GS. The gate capping pattern GP may be formed on the recessed gate electrode GE. The formation of the gate capping pattern GP may include forming a gate capping layer to cover the recessed gate electrode GE and planarizing the gate capping layer to expose the top surface of the first interlayer insulating layer 110. In an implementation, the gate capping layer may be formed of or include SiON, SiCN, SiCON, or SiN.

Referring back to FIGS. 1 to 4, the second interlayer insulating layer 120 may be formed on the first interlayer insulating layer 110. The active contacts AC may be formed to penetrate the second interlayer insulating layer 120 and the first interlayer insulating layer 110 and to be electrically connected to the first source/drain patterns SD1. A gate contact may be formed to penetrate the second interlayer insulating layer 120 and the gate capping pattern GP and to be electrically connected to the gate electrode GE. The formation of the active contacts AC and the gate contact may include forming the barrier pattern BM to fill a contact hole and forming the conductive pattern FM on the barrier pattern BM.

The silicide pattern SC may be formed between the active contact AC and the first source/drain pattern SD1. The formation of the silicide pattern SC may include performing a silicidation process on the first source/drain patterns SD1. In an implementation, the silicide pattern SC may be formed of or include titanium-silicide, tantalum-silicide, tungsten-silicide, nickel-silicide, or cobalt-silicide.

The third interlayer insulating layer 130 may be formed on the second interlayer insulating layer 120. A first interconnection layer may be formed in the third interlayer insulating layer 130. The formation of the first interconnection layer may include forming the interconnection lines IL and forming the vias VI under the interconnection lines IL. The interconnection lines IL and the vias VI may be formed by a damascene process or a dual damascene process. The semiconductor device according to an embodiment may be fabricated through the afore-described method.

Figure 25:
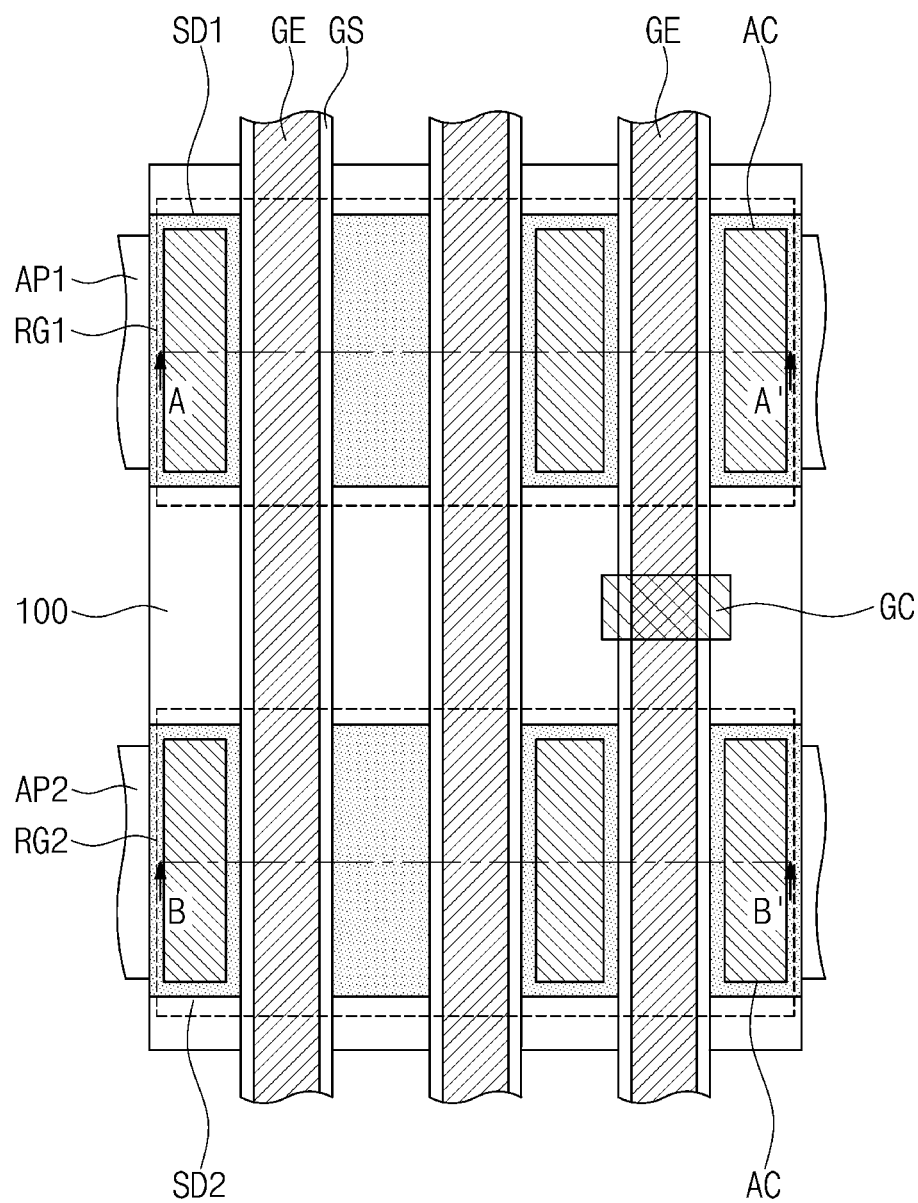
FIG. 25 is a plan view illustrating a semiconductor device according to an embodiment.
Figure 26:
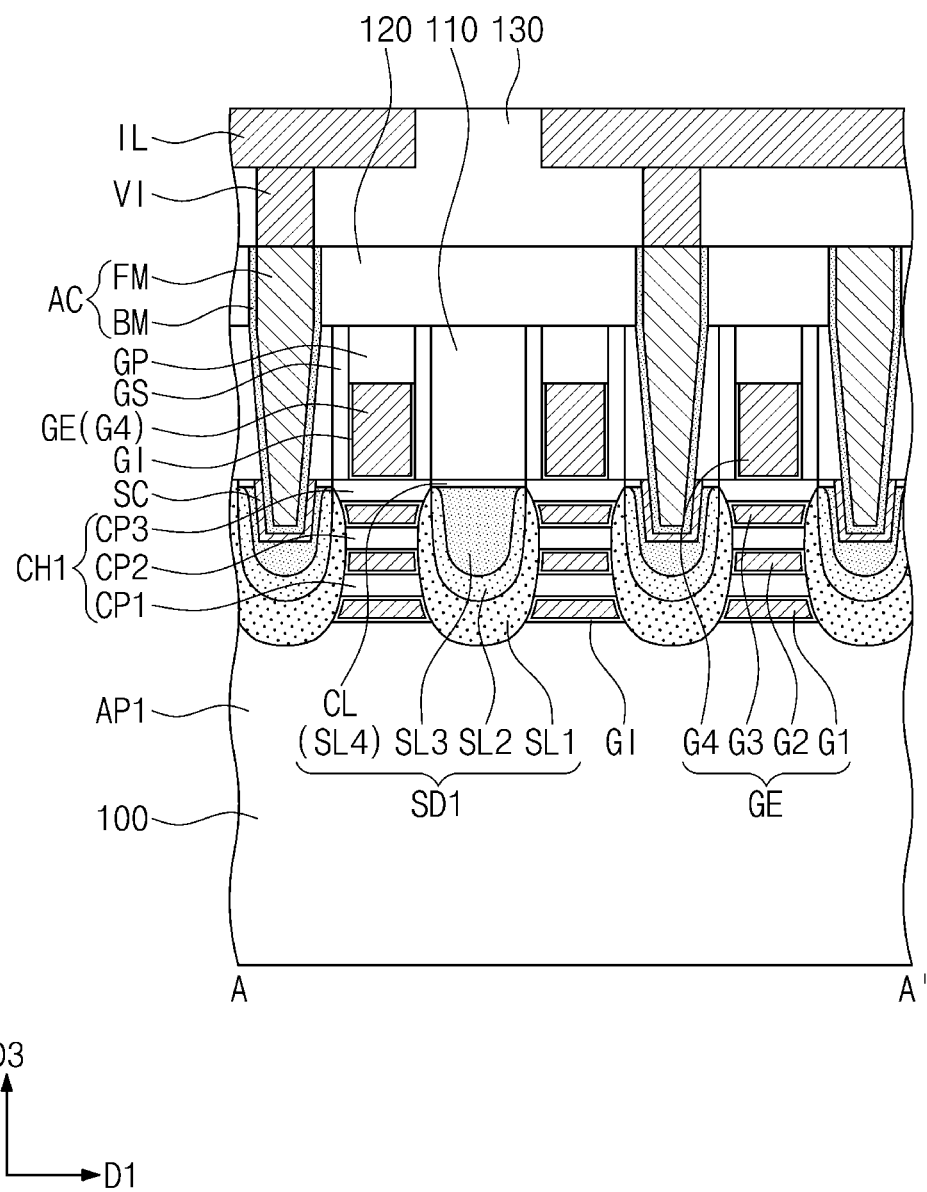
FIGS. 26 and 27 are sectional views taken along lines A-A' and B-B', respectively, of FIG. 25.
Figure 27:
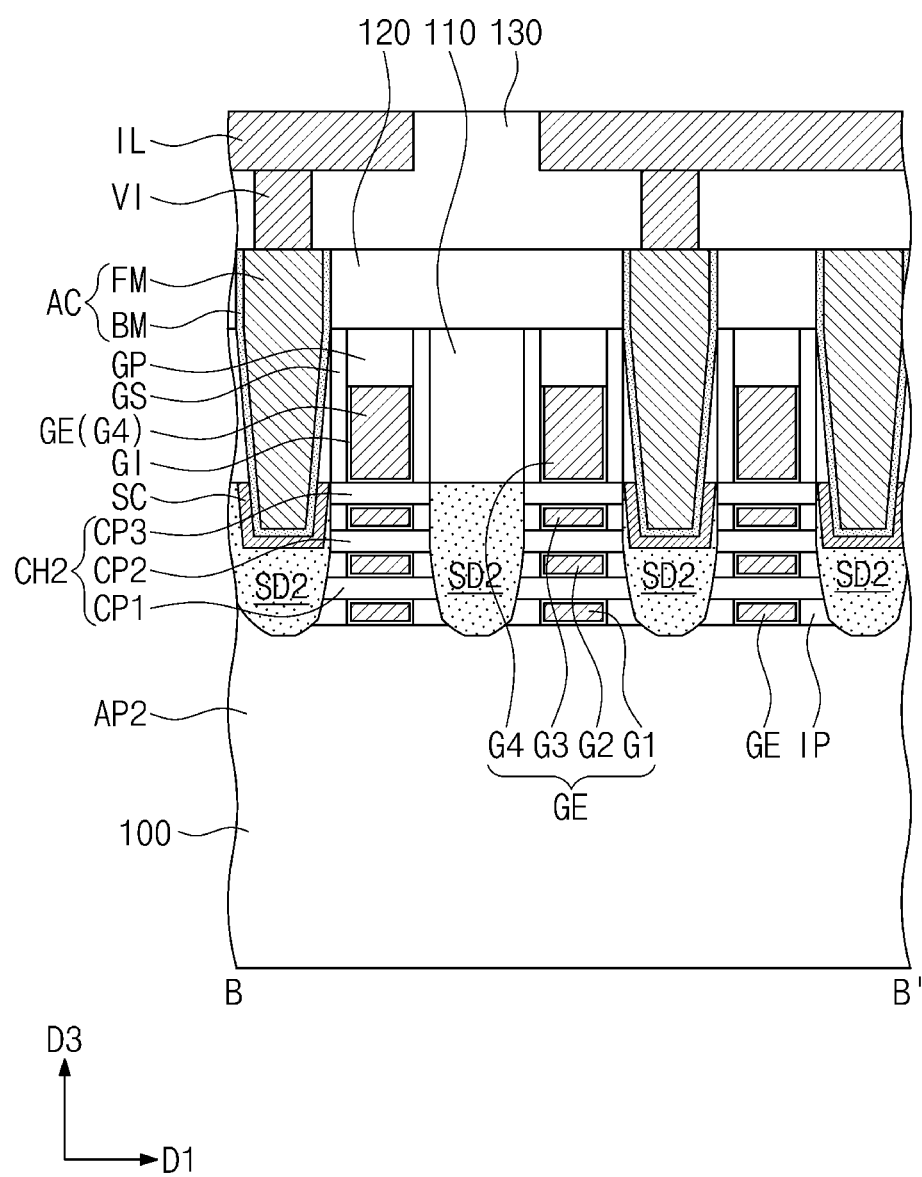

FIG. 25 is a plan view illustrating a semiconductor device according to an embodiment. FIGS. 26 and 27 are sectional views taken along lines A-A' and B-B', respectively, of FIG. 25. For concise description, an element previously described with reference to FIGS. 1 to 9 may be identified by the same reference number without repeating an overlapping description thereof.

Referring to FIG. 25, the substrate 100 may include the second active region RG2, in addition to the first active region RG1. In an implementation, the first and second active regions RG1 and RG2 may be logic cell regions, in which logic transistors constituting a logic circuit of the semiconductor device are disposed. In an implementation, the first active region RG1 may be a PMOSFET region, and the second active region RG2 may be an NMOSFET region. The first and second active regions RG1 and RG2 may be defined by the second trench TR2, which is formed in an upper portion of the substrate 100.

The second active patterns AP2 may be on the second active region RG2. The second active region RG2 may extend in the first direction D1. The second source/drain patterns SD2 may be on the second active patterns AP2. The second source/drain patterns SD2 may be impurity regions of the second conductivity type (e.g., n-type). The recesses RS may be formed on the second active pattern AP2, and the second source/drain patterns SD2 may be respectively formed to fill the recesses RS of the second active pattern AP2.

The second channel patterns CH2 may be on the second active patterns AP2. The second channel patterns CH2 may be between a pair of the second source/drain patterns SD2, which are adjacent to each other. The second channel patterns CH2 may connect an adjacent pair of the second source/drain patterns SD2 to each other. The second channel pattern CH2 may include the semiconductor patterns CP1, CP2, and CP3. The semiconductor patterns may include, e.g., the first semiconductor pattern CP1, the second semiconductor pattern CP2, and the third semiconductor pattern CP3, which are vertically stacked. The first to third semiconductor patterns CP1, CP2, and CP3 may be spaced apart from each other in the third direction D3 that is perpendicular to both of the first and second directions D1 and D2. The first to third semiconductor patterns CP1, CP2, and CP3 may be overlapped with each other, when viewed in a plan view.

The gate electrodes GE may be provided to cross the first and second active patterns AP1 and AP2 and to extend in the second direction D2. The gate electrodes GE may be spaced apart from each other in the first direction D1. The gate electrodes GE may be overlapped with the first and second channel patterns CH1 and CH2, when viewed in a plan view. A pair of the gate spacers GS may be provided on opposite side surfaces of the gate electrode GE. The gate capping pattern GP may be provided on the gate electrode GE.

The gate dielectric pattern GI may be between the gate electrode GE and the second active pattern AP2. The gate dielectric pattern GI may extend along the gate electrode GE and in the second direction D2. The gate dielectric pattern GI may surround each of the second channel patterns CH2. The gate dielectric pattern GI may seal the second channel pattern CH2. The gate dielectric pattern GI may cover a top surface of the device isolation layer ST.

On the second active region RG2, an insulating pattern IP may be between the gate dielectric pattern GI and the second source/drain pattern SD2. The gate electrode GE may be spaced apart from the second source/drain pattern SD2 by the gate dielectric pattern GI and the insulating pattern IP. In an implementation, the insulating pattern IP may be omitted on a first active region PR.

The first interlayer insulating layer 110 and the second interlayer insulating layer 120 may be on the substrate 100. The active contacts AC may penetrate the first and second interlayer insulating layers 110 and 120 and may be connected to the first and second source/drain patterns SD1 and SD2, respectively. The gate contact GC may penetrate the second interlayer insulating layer 120 and the gate capping pattern GP and may be connected to the gate electrode GE.

The third interlayer insulating layer 130 may be on the second interlayer insulating layer 120. The first interconnection layer including the interconnection lines IL and the vias VI may be in the third interlayer insulating layer 130.

Finfet

Figure 28:
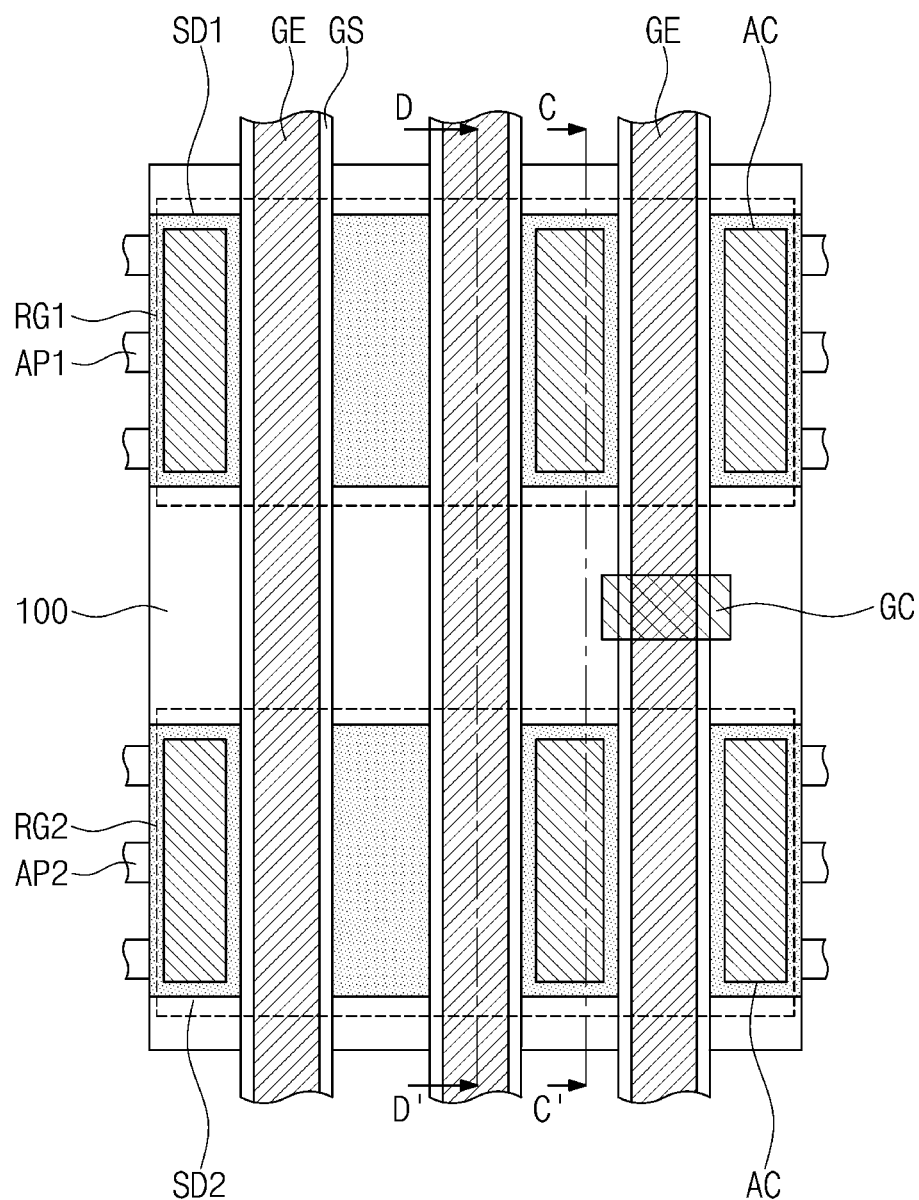
FIG. 28 is a plan view illustrating a semiconductor device according to an embodiment.
Figure 29:
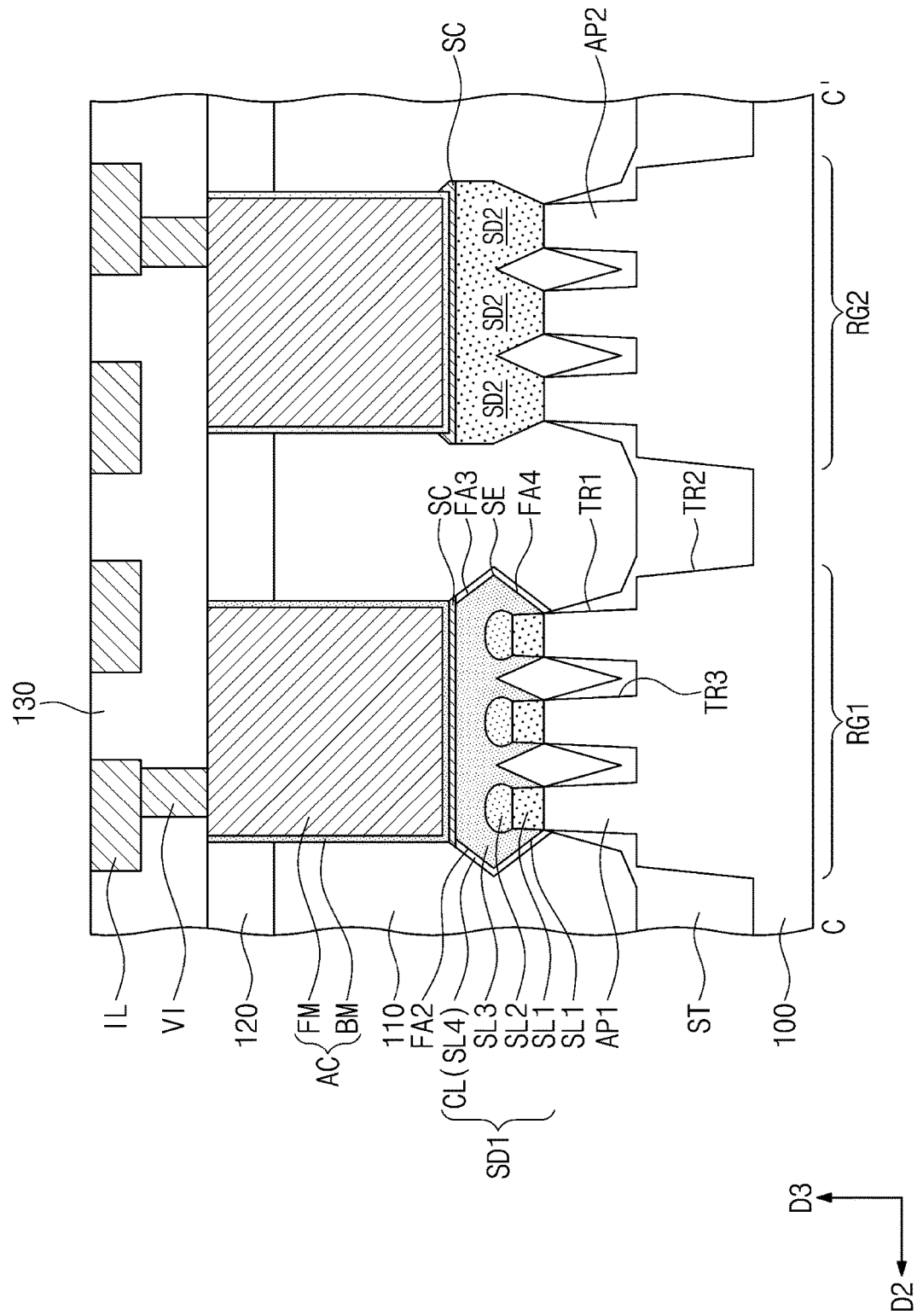
FIGS. 29 and 30 are sectional views taken along lines C-C' and D-D', respectively, of FIG. 28.
Figure 30:
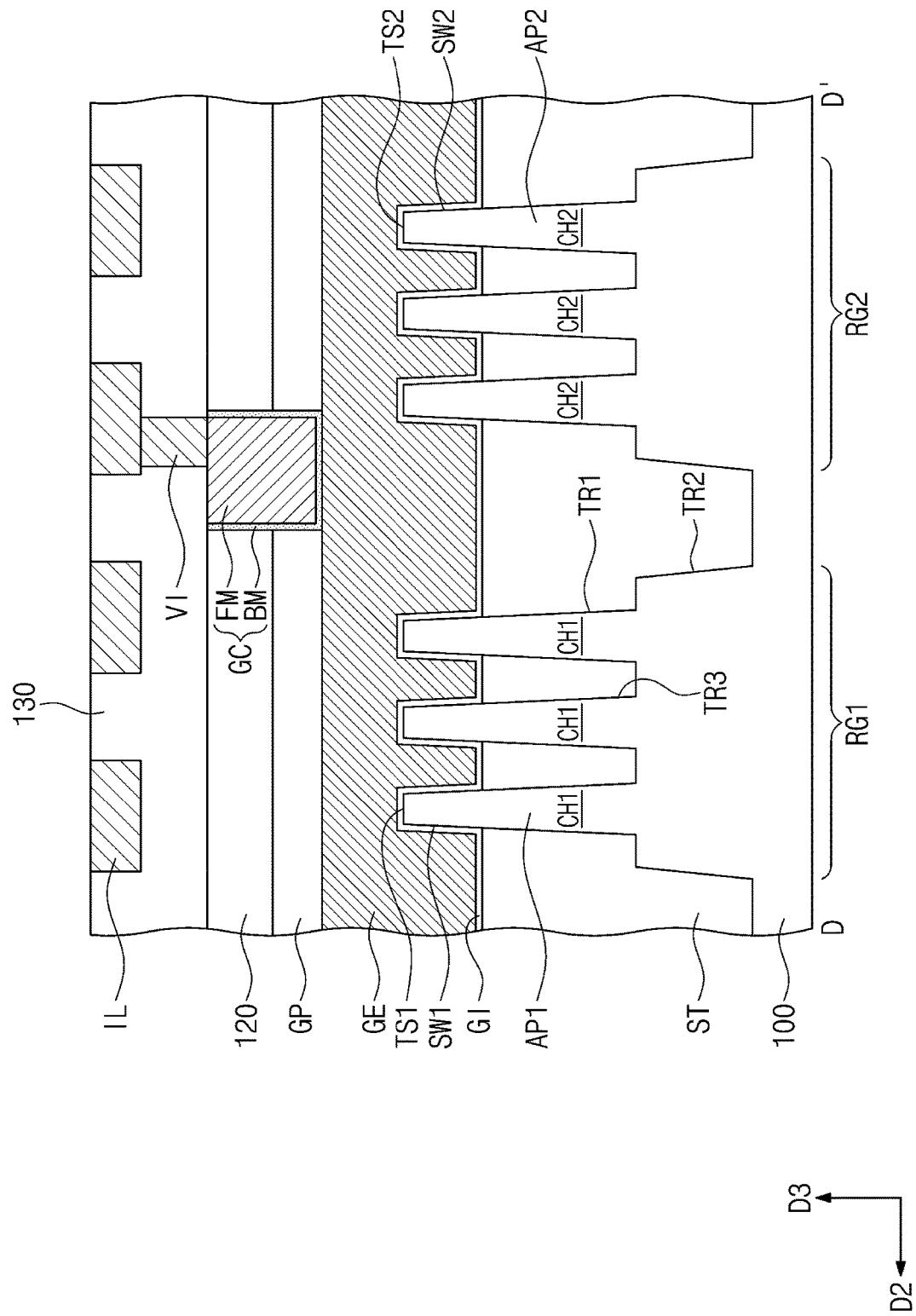

FIG. 28 is a plan view illustrating a semiconductor device according to an embodiment. FIGS. 29 and 30 are sectional views taken along lines C-C' and D-D', respectively, of FIG. 28. For concise description, an element previously described with reference to FIGS. 1 to 9 may be identified by the same reference number without repeating an overlapping description thereof.

Referring to FIGS. 28 to 30, the substrate 100 including the first active region PR and the second active region NR may be provided. In an implementation, the first and second active regions PR and NR may be logic cell regions, on which logic transistors will be formed, and here, the logic transistors may constitute a logic circuit of the semiconductor device. The first active region PR may be a PMOSFET region, and the second active region NR may be an NMOSFET region.

The first and second active regions PR and NR may be defined by the second trench TR2, which is formed in an upper portion of the substrate 100. The second trench TR2 may be located between the first and second active regions PR and NR.

The first active patterns AP1 and the second active patterns AP2 may be on the first active region PR and the second active region NR, respectively. The first and second active patterns AP1 and AP2 may extend in the second direction D2 and may be parallel to each other. The first and second active patterns AP1 and AP2 may be vertically protruding portions of the substrate 100. The first trench TR1 may be defined between adjacent ones of the first active patterns AP1 and between adjacent ones of the second active patterns AP2. The first trench TR1 may be shallower than the second trench TR2.

The device isolation layer ST may fill the first and second trenches TR1 and TR2. The device isolation layer ST may be formed of or include silicon oxide. Upper portions of the first and second active patterns AP1 and AP2 may protrude vertically above the device isolation layer ST (e.g., see FIG. 30). Each of the upper portions of the first and second active patterns AP1 and AP2 may be shaped like a fin. The device isolation layer ST may not cover the upper portions of the first and second active patterns AP1 and AP2. The device isolation layer ST may cover lower sidewalls of the first and second active patterns AP1 and AP2.

The first source/drain patterns SD1 may be on the upper portions of the first active patterns AP1. The first source/drain patterns SD1 may be impurity regions of the first conductivity type (e.g., p-type). The first channel pattern CH1 may be between a pair of the first source/drain patterns SD1. The second source/drain patterns SD2 may be on the upper portions of the second active patterns AP2. The second source/drain patterns SD2 may be impurity regions of the second conductivity type (e.g., n-type). The second channel pattern CH2 may be between a pair of the second source/drain patterns SD2.

The gate electrodes GE may cross the first and second active patterns AP1 and AP2 and may extend in the first direction D1. Each of the gate electrodes GE may surround the top surface and both side surfaces of each of the first and second channel patterns CH1 and CH2.

The gate electrode GE may be on a first top surface TS1 of the first channel pattern CH1 and at least one of the first sidewalls SW1 of the first channel pattern CH1. The gate electrode GE may be on a second top surface TS2 of the second channel pattern CH2 and on at least one of second side surfaces SW2 of the second channel pattern CH2. In an implementation, the transistor according to the present embodiment may be a three-dimensional field-effect transistor (e.g., FinFET), in which the gate electrode GE three-dimensionally surrounds the channel pattern CH1 or CH2.

According to an embodiment, a semiconductor device may include a buffer layer of a source/drain pattern of a PMOSFET for reducing or preventing a stacking fault between a main layer of the source/drain pattern and an active pattern. Accordingly, a channel resistance of the PMOSFET may be reduced. Furthermore, a volume of the main layer of the source/drain pattern may be maintained to be greater than a specific value, and thus, it may be possible to improve performance of the PMOSFET.

One or more embodiments may provide a semiconductor device including a field effect transistor and a method of fabricating the same.

One or more embodiments may provide a semiconductor device with improved electric characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising
    a first active pattern on a first active region of a substrate, the first active pattern extending in a first direction;
    a first channel pattern on the first active pattern, the first channel pattern including semiconductor patterns, which are vertically stacked;
    a first source/drain pattern in a recess in an upper portion of the first active pattern;
    a gate electrode on the first active pattern and extending in a second direction crossing the first direction, the gate electrode surrounding a top surface, at least one side surface, and a bottom surface of each of the semiconductor patterns; and a gate spacer covering a side surface of the gate electrode and having an opening to the semiconductor patterns, wherein:

the first source/drain pattern includes a buffer layer covering inner sides of the recess, when viewed in a plan view, the buffer layer includes an outer side surface and an inner side surface, which are opposite to each other, and when viewed in a plan view, each of the outer and inner side surfaces is a curved surface that is convexly curved toward the gate electrode closest to the buffer layer.

2. The semiconductor device as claimed in claim 1, wherein:

the gate spacer includes a first spacer sidewall, which faces the first direction, and a second spacer sidewall, which is an inner sidewall of the opening, and the buffer layer fully covers the second spacer sidewall, when viewed in a plan view.

3. The semiconductor device as claimed in claim 2, wherein:

the first source/drain pattern further includes a main layer on the buffer layer to fill the recess, and the main layer covers at least a portion of the first spacer sidewall of the gate spacer and is spaced apart from the second spacer sidewall.

4. The semiconductor device as claimed in claim 2, wherein the inner side surface of the buffer layer is continuous with the first spacer sidewall of the gate spacer.

5. The semiconductor device as claimed in claim 2, wherein:

the first source/drain pattern further includes an intermediate layer on the inner side surface of the buffer layer, when viewed in a plan view, the second spacer sidewall includes a first surface and a second surface, which face the opening and are opposite to each other, the buffer layer fills the opening and covers the first surface and the second surface, and the first surface and the second surface are spaced apart from the intermediate layer.

6. The semiconductor device as claimed in claim 1, wherein:

the buffer layer fills the opening, the buffer layer has a sidewall center thickness at a center of the opening and a sidewall edge thickness at an edge of the opening, when viewed in a plan view, and the sidewall center thickness is equal to the sidewall edge thickness.

7. The semiconductor device as claimed in claim 1, wherein:

the recess has a pair of inner side surfaces and a bottom surface connecting the inner side surfaces, the buffer layer includes a pair of side portions on the pair of inner side surfaces, and a center portion connected to the pair of side portions and on the bottom surface of the recess, when viewed in a plan view, the side portions are spaced apart from each other by a first distance in the first direction, at a center portion of the opening, the side portions are spaced apart from each other by a second distance in the first direction, at an edge portion of the opening adjacent to the gate spacer, and the first distance is larger than the second distance.

8. The semiconductor device as claimed in claim 1, wherein:

the first source/drain pattern further includes a main layer on the buffer layer to fill the recess, and a concentration of germanium (Ge) in the main layer ranges from 60 at % to 80 at %.

9. The semiconductor device as claimed in claim 1, wherein:

the recess has a pair of inner side surfaces and a bottom surface connecting the inner side surfaces, the buffer layer covers the pair of inner side surfaces of the recess and exposes the bottom surface of the recess, and the inner side surface of the buffer layer is vertically aligned to a side surface of the gate spacer.

10. The semiconductor device as claimed in claim 1, wherein:

the recess includes a pair of inner side surfaces and a bottom surface connecting the inner side surfaces, the buffer layer includes side portions on the pair of inner side surfaces of the recess, a center portion on the bottom surface of the recess, and an edge portion connecting the side portions to the center portion, and a thickness of the edge portion is smaller than a maximum thickness of each of the side portions.

11. The semiconductor device as claimed in claim 1, wherein:

the recess includes a pair of inner side surfaces and a bottom surface connecting the inner side surfaces, the buffer layer includes side portions on the pair of inner side surfaces of the recess and a center portion on the bottom surface of the recess, each of the side portions has a first thickness at a first level and has a second thickness at a second level lower than the first level, the side portions has a maximum width in the first direction, at the first level, and the first thickness is larger than the second thickness.

12. A semiconductor device, comprising
a first active pattern on a first active region of a substrate, the first active pattern extending in a first direction;

a first channel pattern on the first active pattern, the first channel pattern including semiconductor patterns, which are vertically stacked;

a first source/drain pattern in a recess of an upper portion of the first active pattern;

a gate electrode on the first active pattern and extending in a second direction crossing the first direction; and a gate spacer covering a side surface of the gate electrode and having an opening to the semiconductor patterns, wherein:

the first source/drain pattern includes a buffer layer covering inner sides of the recess, a main layer on the buffer layer to fill the recess, and an intermediate layer between the buffer layer and the main layer, the gate spacer includes a first spacer sidewall facing in the first direction, and a second spacer sidewall, which is an inner sidewall of the opening, when viewed in a plan view, the buffer layer covers the second spacer sidewall, and the second spacer sidewall is spaced apart from the main layer.

13. The semiconductor device as claimed in claim 12, wherein:

the buffer layer includes an outer side surface and an inner side surface, which are opposite to each other, when viewed in a plan view, and the inner side surface is continuous with the first spacer sidewall.

14. The semiconductor device as claimed in claim 13, wherein each of the outer side surface and the inner side surface is a curved surface that is convexly curved toward the gate electrode closest to the buffer layer.

15. The semiconductor device as claimed in claim 12, wherein:
the buffer layer fills the opening,
the buffer layer has a sidewall center thickness at a center of the opening and a sidewall edge thickness at an edge of the opening, when viewed in a plan view, and
the sidewall center thickness is equal to the sidewall edge thickness.

16. The semiconductor device as claimed in claim 12, wherein:
the recess has a pair of inner side surfaces and a bottom surface connecting the inner side surfaces,
the buffer layer has a pair of side portions on the pair of inner side surfaces, and a center portion connected to the pair of side portions and on the bottom surface,
when viewed in a plan view, the side portions are spaced apart from each other by a first distance in the first direction, at a center portion of the opening,
the side portions are spaced apart from each other by a second distance in the first direction, at an edge portion of the opening adjacent to the gate spacer, and
the first distance is larger than the second distance.

17. The semiconductor device as claimed in claim 12, wherein:
the recess has a pair of inner side surfaces and a bottom surface connecting the inner side surfaces,
the buffer layer covers the pair of inner side surfaces of the recess and exposes the bottom surface of the recess, and
the inner side surface of the buffer layer is vertically aligned to a side surface of the gate spacer.

18. The semiconductor device as claimed in claim 12, wherein:
the recess includes a pair of inner side surfaces and a bottom surface connecting the inner side surfaces,
the buffer layer includes side portions on the pair of inner side surfaces of the recess and a center portion on the bottom surface of the recess,
each of the side portions has a first thickness at a first level and has a second thickness at a second level lower than the first level,
the side portions have a maximum width in the first direction, at the first level, and
the first thickness is larger than the second thickness.

19. A semiconductor device, comprising
a substrate including a first active region and a second active region;
a first active pattern on the first active region of the substrate and extending in a first direction;
a first source/drain pattern in a first recess of an upper portion of the first active pattern;
a second active pattern on the second active region of the substrate and extending in the first direction;
a second source/drain pattern in a second recess of an upper portion of the second active pattern;
a gate electrode on a first channel pattern of the upper portion of the first active pattern and a second channel pattern of the upper portion of the second active pattern and extending in a second direction crossing the first direction, each of the first and second channel patterns including semiconductor patterns, which are vertically stacked, the gate electrode surrounding a top surface, at least one side surface, and a bottom surface of each of the semiconductor patterns,
a gate spacer covering a side surface of the gate electrode and having an opening to the semiconductor patterns;
active contacts connected to the first source/drain pattern and the second source/drain pattern;
a plurality of interconnection lines connected to the active contacts;
a plurality of vias provided below the interconnection lines; and
interlayer insulating layers covering the active contacts, the interconnection lines, and the vias,
wherein:
the first source/drain pattern includes a buffer layer covering inner sides of the first recess, an intermediate layer on the buffer layer, and a main layer on the intermediate layer to fill a remaining space of the first recess,
when viewed in a plan view, the buffer layer includes an outer side surface and an inner side surface, which are opposite to each other, and
the outer side surface and the inner side surface are curved surfaces that are convexly curved toward the gate electrode closest to the buffer layer.

20. The semiconductor device as claimed in claim 19, wherein:
the buffer layer fills the opening,
the buffer layer has a sidewall center thickness at a center of the opening and has a sidewall edge thickness at an edge of the opening, when viewed in a plan view, and
the sidewall center thickness is equal to the sidewall edge thickness.

* * * * *